United States Patent
Smith et al.

(10) Patent No.: US 10,373,773 B2
(45) Date of Patent: Aug. 6, 2019

(54) ACTIVE COVER PLATES

(71) Applicant: SNAPRAYS, LLC, Vineyard, UT (US)

(72) Inventors: Jeremy C. Smith, Orem, UT (US); R. Camden Robinson, Lindon, UT (US)

(73) Assignee: SnapRays LLC, Vineyard, UT (US)

( * ) Notice: Subject to any disclaimer, the term of this patent is extended or adjusted under 35 U.S.C. 154(b) by 0 days.

(21) Appl. No.: 16/244,781

(22) Filed: Jan. 10, 2019

(65) Prior Publication Data

US 2019/0148090 A1   May 16, 2019

Related U.S. Application Data

(63) Continuation of application No. 16/166,965, filed on Oct. 22, 2018, which is a continuation-in-part of application No. 15/870,832, filed on Jan. 12, 2018, now Pat. No. 10,109,945.

(60) Provisional application No. 62/460,094, filed on Feb. 17, 2017, provisional application No. 62/522,691, filed on Jun. 21, 2017, provisional application No. 62/536,452, filed on Jul. 24, 2017.

(51) Int. Cl.
| | |
|---|---|
| *H01H 9/18* | (2006.01) |
| *H01R 12/70* | (2011.01) |
| *H01H 9/02* | (2006.01) |
| *H01R 9/16* | (2006.01) |
| *H01H 9/00* | (2006.01) |
| *H01R 43/00* | (2006.01) |
| *H05K 1/11* | (2006.01) |

(52) U.S. Cl.
CPC .......... *H01H 9/182* (2013.01); *H01H 9/0066* (2013.01); *H01H 9/0271* (2013.01); *H01R 9/16* (2013.01); *H01R 12/7076* (2013.01); *H01R 12/7088* (2013.01); *H01R 43/00* (2013.01); *H05K 1/119* (2013.01); *H05K 2201/09027* (2013.01); *H05K 2201/1028* (2013.01); *H05K 2201/10106* (2013.01)

(58) Field of Classification Search
CPC ...... H01R 12/7088; H01R 43/00; H01R 9/16; H01R 12/7076; H05K 1/119; H05K 2201/09027; H05K 2201/10106; H05K 2201/1028; H01H 9/182; H01H 9/0066; H01H 9/0271
See application file for complete search history.

(56) References Cited

U.S. PATENT DOCUMENTS

| | | |
|---|---|---|
| 1,938,309 A | 12/1933 | Williams |
| 2,015,698 A | 10/1935 | Tiffany |
| 2,045,199 A | 6/1936 | Petersen |

(Continued)

FOREIGN PATENT DOCUMENTS

| | | |
|---|---|---|
| CA | 2732657 | 2/2011 |
| CN | 201311835 | 9/2009 |

(Continued)

OTHER PUBLICATIONS

International Search Report for PCT/US2011/050524, pp. 1-3, dated Mar. 28, 2012.

(Continued)

*Primary Examiner* — Dhiru R Patel

(57) ABSTRACT

A variety of active cover plate configurations with prongs configured to contact side screw terminals of electrical receptacles or switches are described.

20 Claims, 22 Drawing Sheets

(56) References Cited

U.S. PATENT DOCUMENTS

| | | |
|---|---|---|
| 2,193,740 A | 9/1938 | Reed |
| 2,134,695 A | 11/1938 | Bigman |
| 2,227,549 A | 1/1941 | McNeill |
| 2,385,620 A | 9/1945 | Fleckenstein |
| 2,428,167 A | 9/1947 | Linton |
| 2,515,820 A | 7/1950 | Clark |
| 2,575,820 A | 11/1951 | Linton |
| 2,580,056 A | 12/1951 | Wheeler, Jr. |
| 2,749,381 A | 6/1956 | Farish |
| 2,880,285 A | 3/1959 | Robison et al. |
| 2,908,743 A | 10/1959 | Premoshis |
| 2,934,590 A | 4/1960 | Thompson et al. |
| 3,120,414 A | 2/1964 | Farish, Jr. |
| 3,168,612 A | 2/1965 | Sorenson |
| 3,307,030 A | 2/1967 | Francisco |
| D212,760 S | 11/1968 | Bordner |
| 3,522,595 A | 8/1970 | White |
| 3,588,489 A | 6/1971 | Gaines |
| 3,680,237 A | 8/1972 | Finnerty, Sr. |
| 3,739,226 A | 6/1973 | Seiter et al. |
| D230,274 S | 2/1974 | Polus |
| 3,859,454 A | 1/1975 | Mann |
| 3,879,101 A | 4/1975 | McKissic |
| 4,000,405 A | 12/1976 | Horwinski |
| 4,038,582 A | 7/1977 | Horwinski |
| 4,117,258 A | 9/1978 | Shanker |
| 4,255,780 A | 3/1981 | Sakellaris |
| 4,282,591 A | 8/1981 | Andreuccetti |
| 4,514,789 A | 4/1985 | Jester |
| 4,534,486 A | 8/1985 | Eidson |
| 4,546,419 A | 10/1985 | Johnson |
| 4,611,264 A | 9/1986 | Bradley |
| 4,616,285 A | 10/1986 | Sackett |
| 4,617,613 A | 10/1986 | Rice |
| 4,755,913 A | 7/1988 | Sleveland |
| 4,774,641 A | 9/1988 | Rice |
| 5,016,398 A | 5/1991 | Fukunaga |
| 5,096,439 A * | 3/1992 | Arnett .................. H01R 13/741 174/66 |
| D330,267 S | 10/1992 | Hendrix |
| 5,153,816 A | 10/1992 | Griffin |
| 5,186,682 A | 2/1993 | Iida |
| 5,248,919 A | 9/1993 | Hanna |
| 5,290,175 A | 3/1994 | Robinson |
| 5,384,428 A | 1/1995 | Luu |
| 5,406,439 A | 4/1995 | Crane et al. |
| 5,473,517 A | 12/1995 | Blackman |
| D366,339 S | 1/1996 | Waller |
| 5,481,442 A | 1/1996 | Dickie et al. |
| 5,485,356 A * | 1/1996 | Nguyen ............... H01R 13/717 174/66 |
| 5,584,725 A | 12/1996 | Tseng |
| 5,622,424 A | 4/1997 | Brady |
| 5,660,459 A | 8/1997 | Appelberg |
| 5,670,776 A | 9/1997 | Rothbaum |
| 5,683,166 A * | 11/1997 | Lutzker ................. H05B 33/06 250/466.1 |
| D395,314 S | 6/1998 | Oikawa |
| D399,825 S | 10/1998 | Heung et al. |
| 5,816,682 A | 10/1998 | Marischen |
| D401,566 S | 11/1998 | Gesmondi |
| 5,833,350 A | 11/1998 | Moreland |
| D407,072 S | 3/1999 | Gaule |
| 5,914,826 A | 6/1999 | Smallwood |
| 6,000,807 A | 12/1999 | Moreland |
| 6,010,228 A | 1/2000 | Blackman et al. |
| 6,023,021 A | 2/2000 | Matthews et al. |
| D427,086 S | 6/2000 | Gaule |
| 6,087,588 A | 7/2000 | Soules |
| 6,089,893 A | 7/2000 | Yu et al. |
| D429,829 S | 8/2000 | Doran |
| D443,500 S | 6/2001 | Luu |
| 6,341,981 B1 | 1/2002 | Gorman |
| D456,239 S | 4/2002 | Luu |
| 6,390,647 B1 | 5/2002 | Shaefer |
| 6,395,981 B1 | 5/2002 | Ford et al. |
| 6,423,900 B1 | 7/2002 | Soules |
| D464,865 S | 10/2002 | Luu |
| 6,457,843 B1 | 10/2002 | Kester |
| D473,528 S | 4/2003 | Wengrower |
| 6,547,411 B1 | 4/2003 | Dornbusch |
| 6,608,253 B1 | 8/2003 | Rintz |
| 6,765,149 B1 | 7/2004 | Ku |
| 6,774,328 B2 | 8/2004 | Adams et al. |
| 6,805,469 B1 | 10/2004 | Barton |
| 6,808,283 B2 | 10/2004 | Tsao |
| D500,743 S | 1/2005 | Saviki, Jr. et al. |
| 6,867,370 B2 | 3/2005 | Compagnone |
| 6,883,927 B2 | 4/2005 | Cunningham et al. |
| 6,891,284 B2 | 5/2005 | Tilley |
| 6,974,910 B2 | 12/2005 | Rohmer |
| 7,011,422 B2 | 3/2006 | Robertson et al. |
| 7,019,212 B1 | 3/2006 | Esmailzadeh |
| 7,036,948 B1 | 5/2006 | Wyatt |
| 7,064,498 B2 | 6/2006 | Dowling et al. |
| D542,627 S | 5/2007 | Rohmer et al. |
| 7,247,793 B2 | 7/2007 | Hinkson |
| 7,270,436 B2 | 9/2007 | Jasper |
| 7,273,983 B1 | 9/2007 | Rintz |
| 7,318,653 B2 | 1/2008 | Chien |
| D561,558 S | 2/2008 | Jackson |
| D561,559 S | 2/2008 | Krumpe |
| D567,633 S | 4/2008 | Anderson |
| 7,360,912 B1 | 4/2008 | Savicki, Jr. |
| D573,005 S | 7/2008 | Huang |
| D576,566 S | 9/2008 | Wu et al. |
| D577,985 S | 10/2008 | Kidman |
| 7,506,990 B2 | 3/2009 | Glazner |
| 7,547,131 B2 | 6/2009 | Faunce et al. |
| 7,576,285 B1 | 8/2009 | Saviki, Jr. |
| D603,984 S | 11/2009 | Richter |
| D606,029 S | 12/2009 | Chou |
| 7,745,750 B2 | 6/2010 | Hewson et al. |
| 7,821,160 B1 | 10/2010 | Roosli et al. |
| 7,850,322 B2 | 12/2010 | Glazner et al. |
| 7,918,667 B1 | 4/2011 | Shim |
| 7,946,871 B1 | 5/2011 | Yu et al. |
| 8,003,886 B1 | 8/2011 | Rintz |
| D650,112 S | 12/2011 | Bryant |
| 8,148,637 B2 | 4/2012 | Davidson |
| D666,471 S | 9/2012 | Peckham |
| 8,304,652 B2 | 11/2012 | McBain |
| 8,393,747 B2 | 3/2013 | Kevelos et al. |
| 8,511,866 B1 | 8/2013 | Mendez |
| 8,564,279 B2 | 10/2013 | Johnson et al. |
| 8,668,347 B2 | 3/2014 | Ebeling |
| 8,697,991 B2 | 4/2014 | Davidson |
| 8,797,723 B2 | 8/2014 | Hilton et al. |
| D719,699 S | 12/2014 | Bryant |
| 8,912,442 B2 | 12/2014 | Smith |
| D721,043 S | 1/2015 | Tonnesen |
| 9,035,180 B2 | 5/2015 | Smith et al. |
| 9,035,181 B2 | 5/2015 | Smith et al. |
| 9,362,728 B2 | 6/2016 | Smith et al. |
| 9,464,795 B2 | 10/2016 | Ebeling |
| 9,482,426 B2 | 11/2016 | Diotte |
| 9,742,111 B2 | 8/2017 | Smith et al. |
| 9,755,374 B2 | 9/2017 | St. Laurent et al. |
| 9,768,562 B2 | 9/2017 | Smith et al. |
| 9,774,154 B2 | 9/2017 | St. Laurent et al. |
| 9,787,025 B2 | 10/2017 | Smith et al. |
| 9,807,829 B2 | 10/2017 | Jensen |
| 9,832,841 B2 | 11/2017 | Knight et al. |
| 9,871,324 B2 | 1/2018 | Smith et al. |
| 9,882,318 B2 | 1/2018 | Smith et al. |
| 9,882,361 B2 | 1/2018 | Smith et al. |
| 9,899,814 B2 | 2/2018 | Smith et al. |
| 9,917,430 B2 | 3/2018 | Smith et al. |
| 10,109,945 B2 | 10/2018 | Smith et al. |
| 2001/0046130 A1 | 11/2001 | Cunningham et al. |
| 2002/0131262 A1 | 9/2002 | Amburgey |
| 2003/0013503 A1 | 1/2003 | Menard et al. |
| 2003/0124022 A1 | 7/2003 | Georges et al. |
| 2004/0247300 A1 | 12/2004 | He et al. |

(56) References Cited

U.S. PATENT DOCUMENTS

| | | |
|---|---|---|
| 2005/0264383 A1 | 12/2005 | Zhang |
| 2006/0065510 A1 | 3/2006 | Kiko et al. |
| 2006/0072302 A1 | 4/2006 | Chien |
| 2006/0077684 A1 | 4/2006 | Yuen |
| 2006/0161270 A1 | 7/2006 | Luskin et al. |
| 2006/0170380 A1 | 8/2006 | Evans |
| 2006/0262462 A1 | 11/2006 | Barton |
| 2007/0120978 A1 | 5/2007 | Jones |
| 2008/0073117 A1 | 3/2008 | Misener |
| 2008/0266121 A1 | 10/2008 | Ellul |
| 2009/0153438 A1 | 6/2009 | Miller et al. |
| 2009/0225480 A1 | 9/2009 | Baxter |
| 2009/0284385 A1 | 11/2009 | Tang et al. |
| 2009/0322159 A1 | 12/2009 | Dubose et al. |
| 2010/0033950 A1 | 2/2010 | Farrell |
| 2011/0056720 A1 | 3/2011 | Davidson |
| 2011/0210833 A1 | 9/2011 | McNeely et al. |
| 2011/0228552 A1 | 9/2011 | Kevelos et al. |
| 2012/0008307 A1 | 1/2012 | Delany |
| 2012/0068612 A1 | 3/2012 | Ebeling |
| 2012/0156937 A1 | 6/2012 | Almouli |
| 2012/0182172 A1 | 7/2012 | Sorensen |
| 2012/0215470 A1 | 8/2012 | Maguire |
| 2012/0316808 A1 | 12/2012 | Frader-Thompson et al. |
| 2013/0063848 A1 | 3/2013 | Thorpe et al. |
| 2013/0076242 A1 | 3/2013 | Moreland |
| 2013/0221868 A1 | 8/2013 | Diotte et al. |
| 2015/0371534 A1 | 12/2015 | Dimberg et al. |
| 2017/0018890 A1 | 1/2017 | St. Laurent et al. |
| 2017/0018897 A1 | 1/2017 | St. Laurent et al. |
| 2017/0214188 A1 | 7/2017 | Smith |
| 2018/0048099 A1 | 2/2018 | Diotte |

FOREIGN PATENT DOCUMENTS

| | | |
|---|---|---|
| DE | 202006006354 | 10/2007 |
| EP | 2211210 | 3/2007 |
| KR | 1019930025223 | 6/1995 |
| KR | 1019950015932 | 6/1995 |
| KR | 20090121424 | 11/2009 |
| KR | 1020080047328 | 11/2009 |
| KR | 100955064 | 4/2010 |
| KR | 1020090098056 | 4/2010 |
| WO | 2007122141 | 11/2007 |
| WO | 2012006812 | 1/2012 |
| WO | 2012033746 | 3/2012 |
| WO | 2013019394 | 2/2013 |
| WO | 2014070863 | 5/2014 |

OTHER PUBLICATIONS

Written Opinion of the International Searching Aurhtority for PCT/US2011/050524, pp. 1-3, dated Mar. 7, 2013.
International Preliminary Report on Patentability for PCT/US2011/050524, pp. 1-4, dated Mar. 13, 2013.
U.S. Appl. No. 61/380,561 made publicly accessible with U.S. Patent Application Publication No. 2013/0221868 filed Aug. 29, 2013, pp. 1-19.
Office Action dated Jan. 26, 2018 for U.S. Reexam 90/014,022.
Office Action dated Feb. 23, 2018 for U.S. Re-exam Application No. 90/014,021.
Office Action dated Sep. 20, 2018 for U.S. Appl. No. 15/920,047.
Permaglo Night Light, www.costco.ca, accessed Mar. 21, 2017, 4 pgs.
Permaglo Safety Lighting Products, www.pemaglo.com, accessed Mar. 21, 2017, 1 pg.
Request for Ex Parte Reexamination for U.S. Pat. No. 9,035,180, May 19, 2015.
TekSyCo Technical Systems Company—Plug into the Future, at least as early as Jul. 16, 2009.
Request for Ex Parte Reexamination for U.S. Pat. No. 8,912,442 , May 19, 2015.
Decorator Combination Tamper-Resistant Nightlight/GFCI, White 1595NTL54WCC4. Datasheet (online). Legrand http://www.legrand.us/PassAndSeymour/GFCI/GFCI-Receptacles/Tamper-Resistant/Combination-Nightlight-GFCI-Receptacle/1595NTITRWCC4.aspx ,May 2012.
LED Nightlight. Datasheet (online). Feit Electric http://letsgogreen.biz/pages/nightlights.html ,May 2012.
Leviton Glow Guide Night Light. Datasheet (online). Leviton. http://www.amazon.com/Leviton-Glow-Guide-Night-Light/dp/B000GYF8XY/ref=sr_1_2?s=home-garden&ie=UTF8&qid=1299008596&sr-1-21 ,May 2012.
Louvered Recessed Night Light with 10 Watts. Datasheet (online). American Lighting LLC http://www.csnstores.com/American-Lighting-LLC-RNLS-1-ali923.html?cv ,May 2012.
Louvered Recessed Night Light with 2x.25 Watt LED. Datasheet (online). American Lighting, LLC. http://www.csnstores.com/American-Lighting-LLC-RNLS-3-ali1927.html ,May 2012.
NL3/LED Three LED Sensor Night Light plus 3-plug Outlet. Datasheet (online). Feit Electric http://www.amazon.com/Feit-Electric-NL#-LED-Sensor/dp/B000I1AC0/ref=sr_1)48?s=home-garden&ie=UTF8&qid=1299008626&sr=1-48 ,May 2012.
8 LED Nightlights. Datasheet (online). Feit Electric hppp://www.amazon.com/Feit-Electric-8-LED-Nightlights/dp/B001OZ33FY/ref=sr_1_50?s=home-garden&ie=UTF8&quid-1299008671&sr=1-50 ,May 2017.
Initial Expert Report of Michael Thuma.
Ontel answer and Affirmative Defenses to Plaintiff's Second Amended Complaint, U.S. District Court filing ,Jun. 5, 2017.
Ontel Defendants LPR 2.2(b) Initial Disclosures, U.S. District Court filing ,Jul. 14, 2017.
Ontel Defendants LPR 2.4 Preliminary Non-Infringement and Invalidity Contentions, Aug. 8, 2017.
Ontel Defendants Memorandum in Opposition to Plaintiff's Motion for Leave to File a Second Amended Complaint, U.S. District Court filing ,Apr. 11, 2017.
Pass & Seymore/Legrand Keeps Kids Safer with Over 100 Kinds of Tamper-Resistant Electrical Outlets, PR Newswire news alert, visited Oct. 2018 ,Feb. 2008.
Plate Pals Wallplate Thermometers, http://www.platepats.com/home.html. Last visited Apr. 12, 2017. ,2006.
Respondent Alltrade Tools LLC's Invladity Contentions—Service.
Respondent Alltrade Tools LLC's Notice of Prior Art.
Respondent Alltrade Tools LLC's Second Supplemental Invalidity Contentions.
Respondent Alltrade Tools LLC's Supplemental Invalidity Contentions.
Respondent Enstant Technology Co., Ltd.'s Response to Compainant Snaprays, LLC's Invalidity Contentions Interrogatories.
Respondent Ontel Products Corporation's Notice of Prior Art.
Respondents Enstant Technology Co., Ltd. And Vistek Technology Co., Lts's Notice of Prior Art.
UL Warns of Light with Unauthorized UL Mark, The Associated Press New Alert, visited Oct. 2018 ,Jul. 2009.

\* cited by examiner

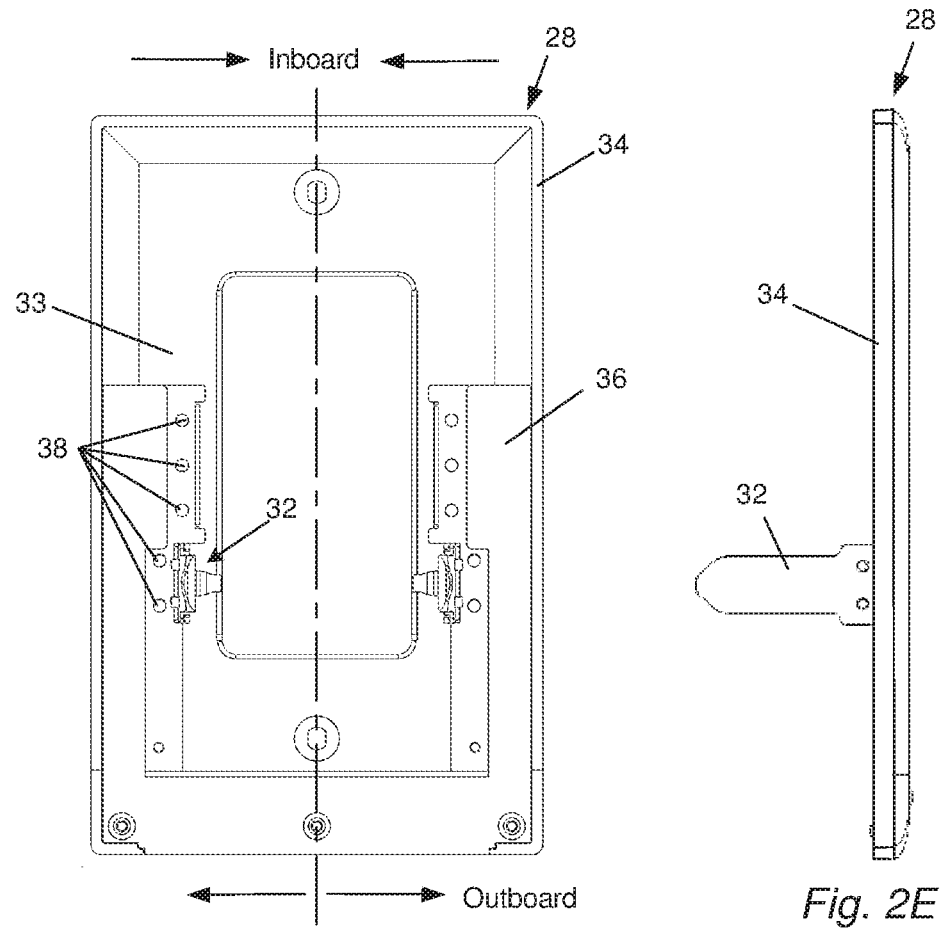
Fig. 2D
Fig. 2E
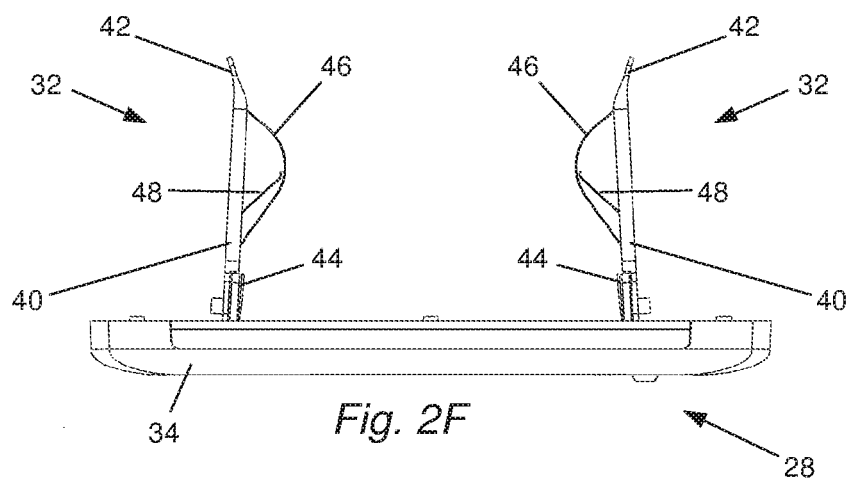
Fig. 2F

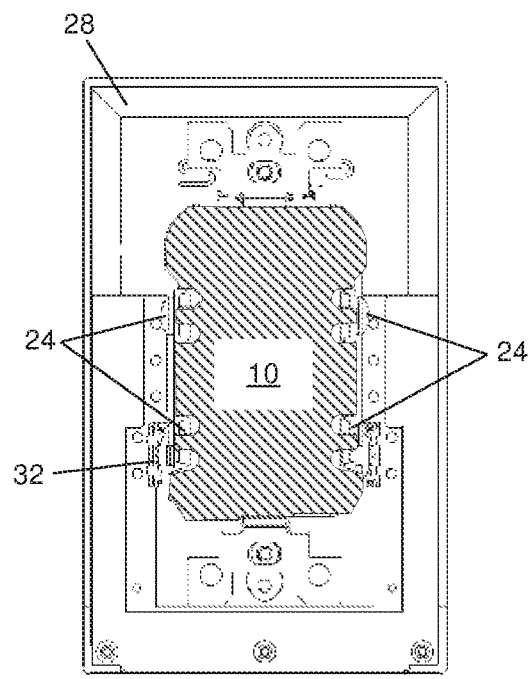
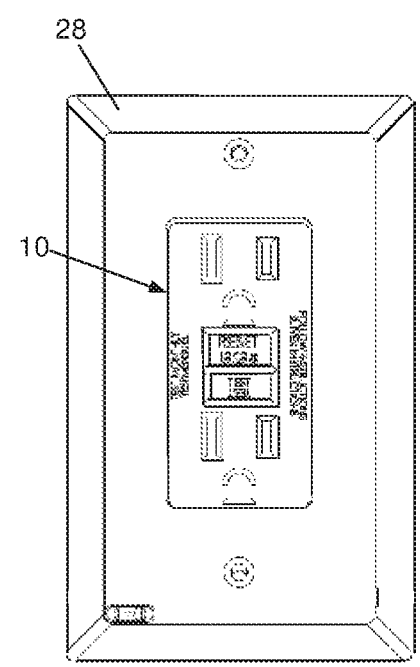
Fig. 3A                Fig. 3B
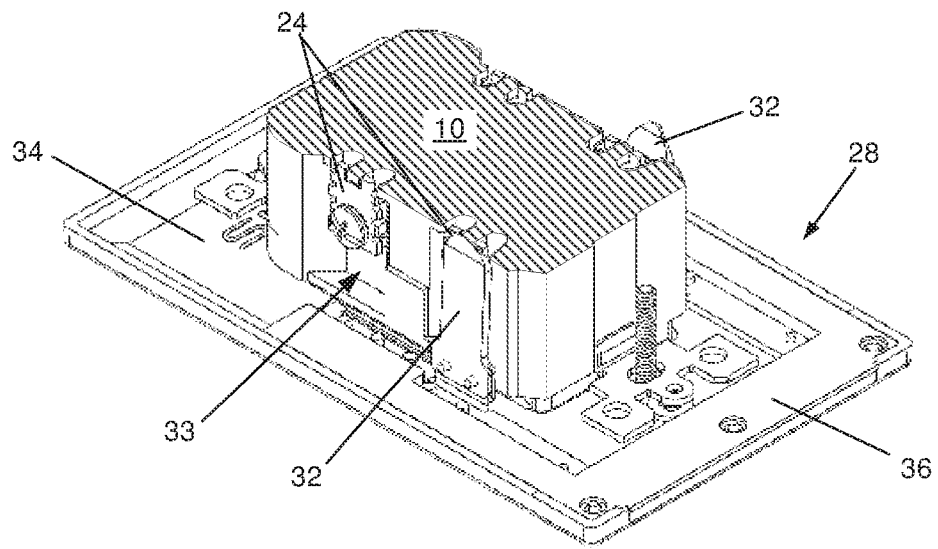
Fig. 3C

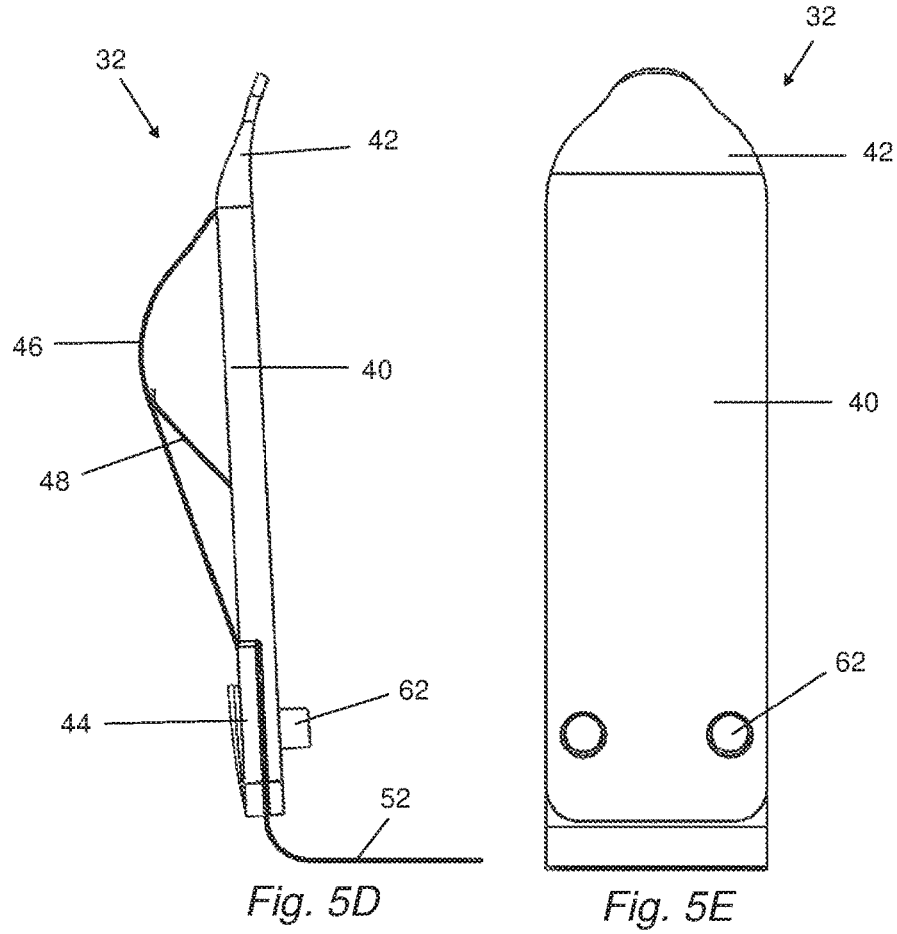
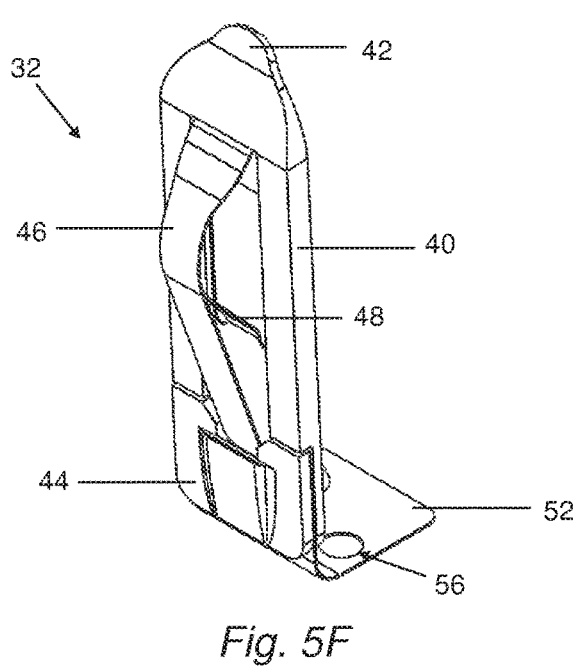
Fig. 5D  Fig. 5E
Fig. 5F

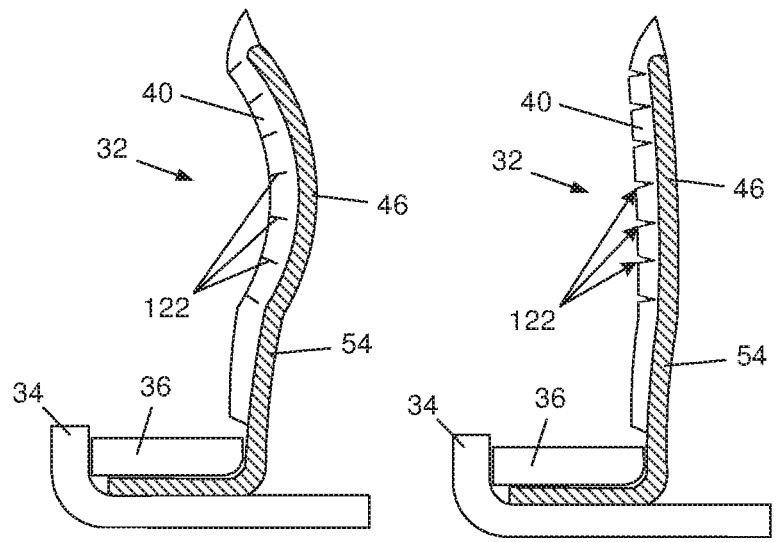
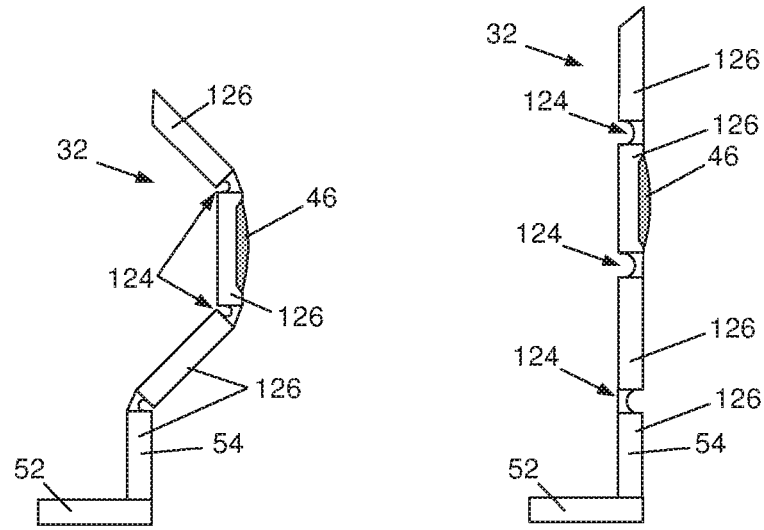
Fig. 11A  Fig. 11B
Fig. 11C  Fig. 11D

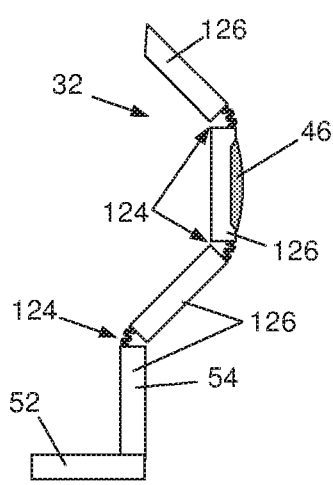
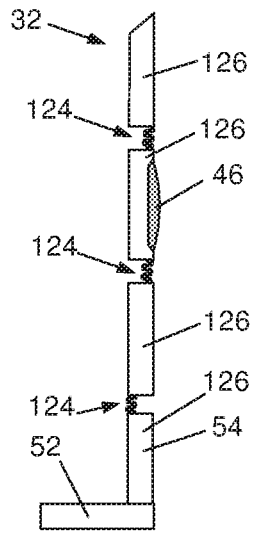
*Fig. 11E*  *Fig. 11F*
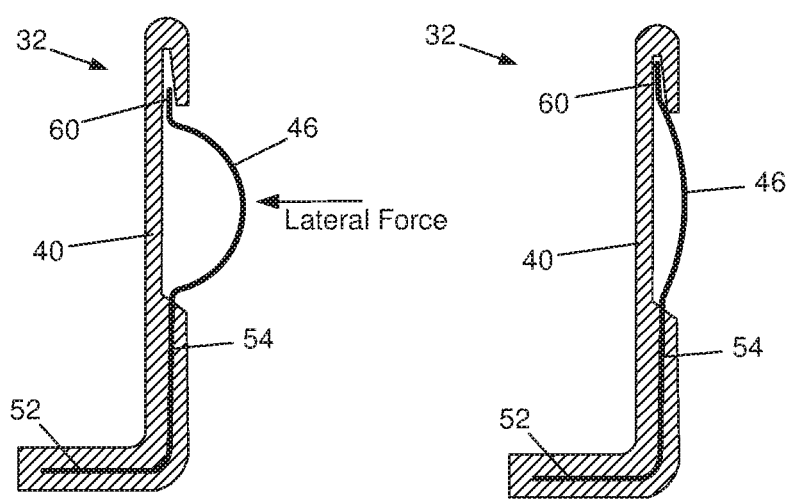
*Fig. 11G*  *Fig. 11H*

ACTIVE COVER PLATES

RELATED APPLICATIONS

The present application is a continuation of U.S. patent application Ser. No. 16/166,965 filed Oct. 22, 2018, which is a continuation-in-part of U.S. patent application Ser. No. 15/870,832 filed Jan. 12, 2018, issued as U.S. Pat. No. 10,109,945, which claims the benefit of U.S. Provisional Application Ser. No. 62/460,094 filed Feb. 17, 2017, U.S. Provisional Application Ser. No. 62/522,691 filed Jun. 21, 2017, and U.S. Provisional Application Ser. No. 62/536,452 filed Jul. 24, 2017.

U.S. patent application Ser. No. 16/166,965, U.S. patent application Ser. No. 15/870,832, U.S. Provisional Application Ser. No. 62/460,094, U.S. Provisional Application Ser. No. 62/522,691, and U.S. Provisional Application Ser. No. 62/536,452 are each hereby incorporated by reference.

BACKGROUND

Modern buildings include wiring to deliver electrical power to lights, outlets, and other devices. The electrical wiring typically terminates in an electrical box in a wall, ceiling, floor or the box may be connected to another structural element. Connections are made to the wiring in the electrical box. For example, electrical wiring may be connected to outlets and switches by stab-in connectors or with screw terminals on the sides of the outlet/switch body. After installation, a wall plate is placed over the outlet/switch body to cover the opening to the box while allowing access to the outlet receptacles and/or access to manually manipulate the switch(es).

BRIEF DESCRIPTION OF THE DRAWINGS

The accompanying drawings illustrate various examples of the principles described herein and are a part of the specification. The illustrated examples are merely examples and do not limit the scope of the claims.

FIGS. 2A-2K are diagrams and images of an illustrative GFCI active cover plate and various prongs for use with the active cover plate, according to one example of principles described herein.

FIG. 3A-3C are illustrations of a GFCI active cover plate installed over a GFCI outlet, according to one example of principles described herein.

FIGS. 5A-5I show various illustrative GFCI prongs for a GFCI active cover plate, according to one example of principles described herein.

FIGS. 11A-11H show various illustrative examples of prongs for active cover plates, according to one example of principles described herein.

Throughout the drawings, identical reference numbers designate similar, but not necessarily identical, elements.

DETAILED DESCRIPTION

Reference will now be made to the figures wherein like structures will be provided with like reference designations. In the following description, for purposes of explanation, numerous specific details are set forth in order to provide a thorough understanding of the present systems and methods. It will be apparent, however, that systems and methods may be practiced without these specific details. It is understood that the figures are diagrammatic and schematic representations of some embodiments of the invention, and are not limiting of the present invention, nor are they necessarily drawn to scale. Reference in the specification to "an example" or similar language means that a particular feature, structure, or characteristic described in connection with the example is included in at least that one example, but not necessarily in other examples. Additionally, features shown and/or described in connection with one figure may be combined with features shown and/or described in connection with other figures.

Figure 1A:
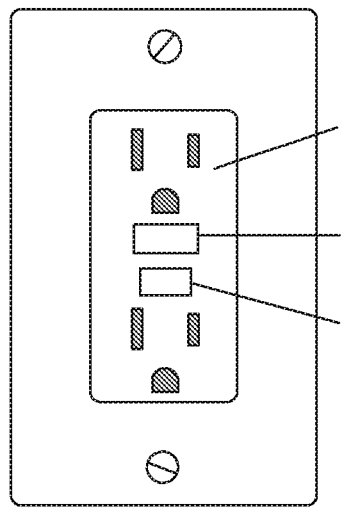
FIGS. 1A-1C are drawings of GFCI outlet installations, according to one example of principles described herein.
Figure 1B:
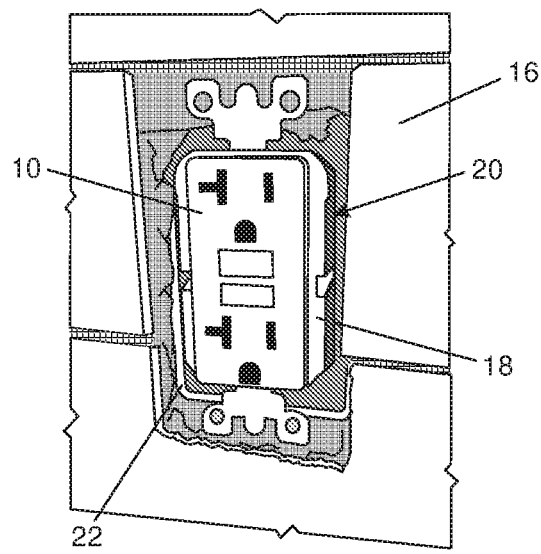
Figure 1C:
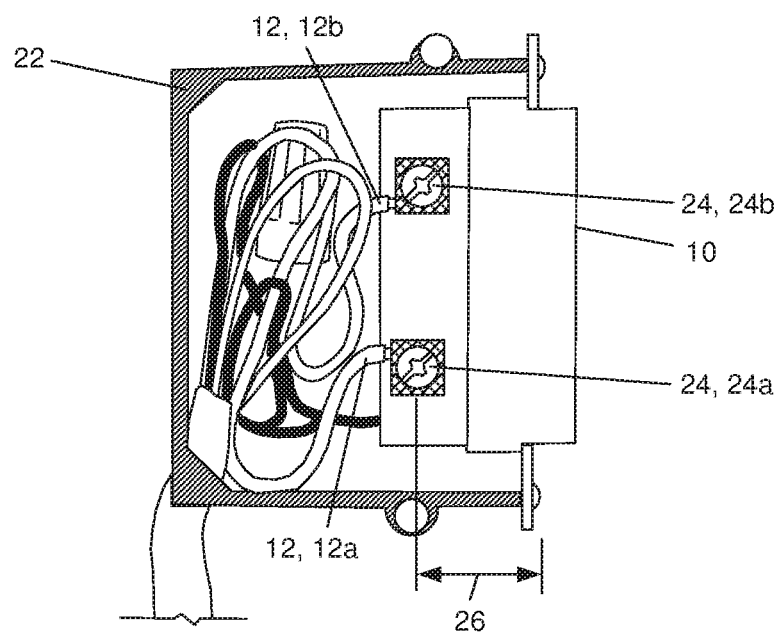

FIGS. 1A-1C show various views of ground fault circuit interrupter (GFCI) outlets 10. GFCI outlets 10 are designed to quickly and automatically disconnect a circuit when they detect that the electric current is not balanced between the energized (line) conductor(s) and the return (neutral) conductor. Under normal circumstances, these two wires are expected to carry matching currents, and any difference may indicate that a short circuit or other electrical anomaly is present, such as leakage. There may be a variety of different configurations of the screw terminals and GFCI outlet geometry. For example, the hot and neutral wires may be on opposite sides of the GFCI outlet. Additionally, there may be load screw terminals that are connected to outlets "downstream/daisy chained" from the GFCI outlet. These downstream outlets may also be benefited by the GFCI protection.

Leakage may indicate a shock hazard (or shock in progress) which is a potential danger to a person. Current leakage may result in harm or death due to electric shock, especially if the leaking electric current passes through the torso of a human. A current of around 30 mA (0.030 amperes) may be sufficient to cause cardiac arrest or serious harm if it persists for more than a fraction of a second.

GFCI outlets 10 are designed to disconnect the conducting wires 12 quickly enough to prevent serious injury from such shocks. The buttons 14a, 14b on the face of the GFCI outlet 10 are "test" and "reset" buttons. The test button 14a may cause a small amount of power to be sent to ground or a neutral wire, simulating a short. When the test button 14a is depressed, the GFCI should disconnect ("trip") and power to the outlet 10 should be disconnected.

After a trip event, the "reset" button 14a may be depressed to reset the GFCI configuration and reenergize the outlet 10. The buttons 14a, 14b are shown in FIG. 1A. In this example, the reset button 14b is the larger button and the test button 14a is the smaller button. Other GFCI outlets 10 may have different configurations. GFCI outlets 10 may also be known as "residual current devices"; ground fault interrupters "GFI"; and more sophisticated versions may include arc fault circuit interrupters ("AFCI," "AFCI/GFCI" or "AF/ GF").

FIG. 1B shows a GFCI outlet 10 installed in a wall with a tile wall covering 16. GFCI outlets 10 may be wider (e.g., have wider shoulders 18) than standard outlets because of the additional circuitry and electrical components that they contain. Consequently, there may be a relatively small gap 20 between the sides of the outlet 10 and the sides of the electrical/receptacle box 22 in which the outlet 10 is installed. This can have significant consequences for active cover plates that use prongs to contact screw terminals 24 of GFCI outlets 10. The prongs should fit in the open space 20 between the GFCI outlet 10 and the box 22 in order to reach the screw terminals 24 on the sides of the GFCI outlet 10. The smaller the space 20, the thinner the prongs must be to fit.

FIG. 1C shows a side view of a GFCI outlet 10 installed in a receptacle box 22. One side of the receptacle box 22 has been cut away to allow for a clear view into the box 22 and behind the GFCI outlet 10. There are several things that can be noted from this picture. First, the screw terminals 24 are not located in the same position as a standard outlet. The screw terminals 24 are farther back and recessed into the body of the outlet 10 (i.e., there is a greater distance 26 between the front of the outlet 10 and the screw terminals 24). Presumably the designers recessed the screw terminals 24 to allow wires to make connections without causing the GFCI outlet width to increase beyond its already significant size.

GFCI outlets 10 typically include four screw terminals 24, two on each side. A first set of opposing screw terminals 24b may be designated as "line" terminals. The house wiring 12 that supplies power to the outlet 10 may be connected there, with the hot line connected to one terminal and the neutral line connected to the other terminal.

A second set of opposing screw terminals 24a may also be located on the body of a GFCI outlet 10. This other set of screw terminals 24a may be designated as the "load" screw terminals 24. These load screw terminals 24a may not be used when the GFCI outlet 10 is used by itself. However, additional outlets may be connected to the GFCI outlet 10 ("daisy chained") using the load screw terminals 24a. These additional "daisy chained" outlets may be standard outlets, but because they are connected to power through the GFCI outlet 10 they may also be protected from ground faults by the GFCI outlet 10.

In selected embodiments, an active cover plate designed for GFCI outlets 10 may be connected to either the line or load terminals 24. If the active cover plate is connected to the line terminals 24b (the other line terminal may be on the opposite side of the GFCI outlet), it will be powered regardless of the operation of the GFCI outlet 10. For example, if the GFCI were to detect a fault and trip, the active cover plate may remain on and functioning. The active cover plate may have its own internal current-limiting safeguards. Conversely, if the active cover plate were connected to the load terminals 24a (the other load screw terminal may be on the opposite side of the GFCI outlet 10), it may act like any other circuit that is connected through the GFCI outlet 10 and have additional protection against ground faults.

As illustrated in FIG. 1C, there can be a large number of wires 12 packed behind a GFCI outlet 10. Because the body of the GFCI outlet 10 may be larger than the bodies of standard outlets, the wires 12 may be more tightly packed behind it. In some embodiments, the prongs of the active cover plate may have specific features that are designed to avoid contacting the wires 12 behind the GFCI outlet 10.

For example, the wires 12 may prevent the active cover plate/functional wall plate from installing because the prongs jam into the wires 12. Additionally or alternatively, the prongs may be lifted off the screw terminals 24 as they encounter wires 12. The setback distance 26 from the outlet mount to the screw terminal 24 is also designated in the figure. The setback distance 26 may change between various models of GFCI outlets 10 and can place additional compatibility requirements on prongs that are designed for use with a wide range of GFCI outlets 10.

Figure 2A:
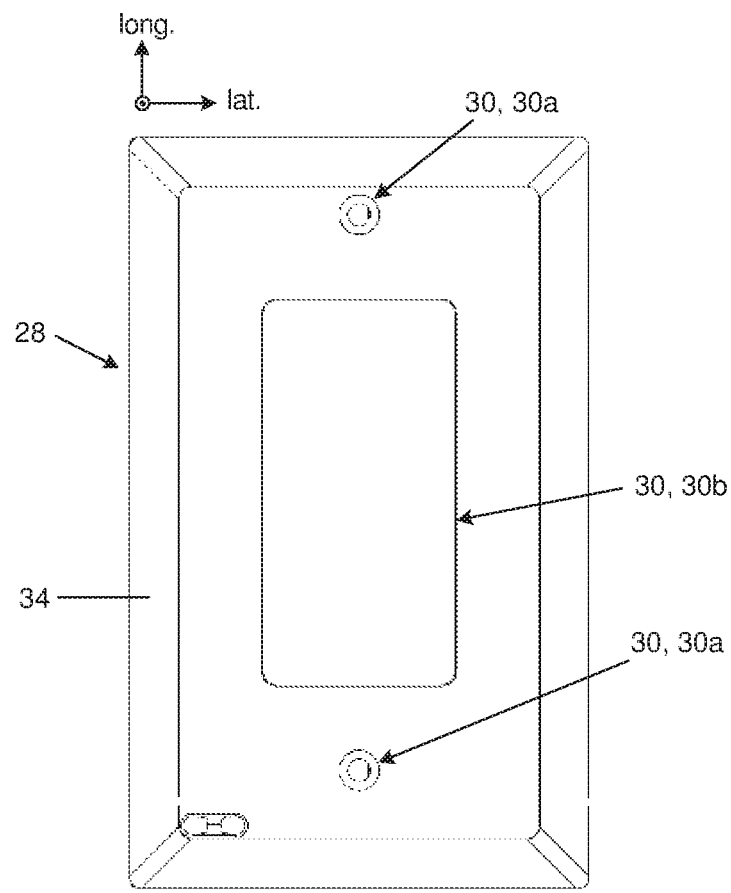
Figure 2B:
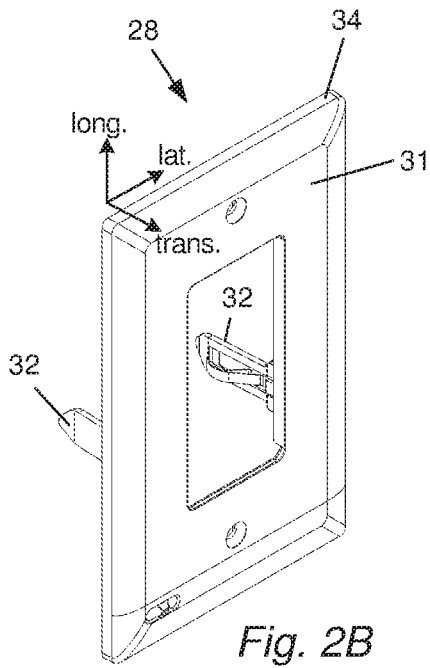
Figure 2C:
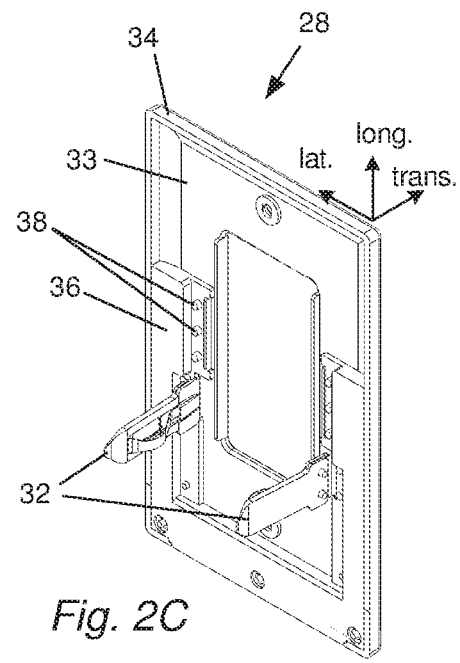

The remaining figures and associated text in the application show various embodiments of active cover plates and prongs that are configured to make contact with electrical receptacles. These electrical receptacles may include light switches and outlets. The examples given below specifically refer to GFCI outlets but the principles described are not limited to GFCI outlets and may be used in any of a variety of active cover plate and electrical receptacle configurations. There are several illustrative examples of nomenclature that can be used to describe the relationship of various elements to each other. FIGS. 2A, 2B, and 2C show one example of an illustrative coordinate system that can be used to define directions for the active cover plate. The three orthogonal axes are labeled "long." for longitudinal, "lat." for lateral, and "trans." for transverse. FIG. 2D shows additional nomenclature that defines the direction "outboard" as being away from the centerline of the active cover plate and "inboard" as being toward the centerline of the cover plate.

FIG. 2A shows a front view of one embodiment of a GFCI active cover plate 28 (e.g., an active cover plate 28 suitable for use with one or more GFCI outlets 10). The GFCI active cover plate 28 may have a number of apertures 30, including one or more screw apertures 30a and one or more aperture(s) 30b through which a GFCI outlet 10 or buttons 14 thereof may be accessed.

FIGS. 2B and 2C are front and rear perspective views, respectively, that show prongs 32 extending rearward (in the transverse direction) from a front plate 34 of an active cover plate 28. The front plate 34 includes a front surface 31 and a back surface 33. In some examples, a base of the prongs 32 may be sandwiched between a back plate 36 on an active cover plate 28 and a front plate 34 thereof. The back plate 36 and/or front plate 34 may include a number of additional features, including additional posts 38 that can be used to secure the back plate 36 to the front plate 34 and/or to secure different prongs 32 for connection to ordinary outlets.

FIG. 2D shows a rear view of the GFCI active cover plate 28 with the prongs 32 extending rearward from the rear surface 33 of the front plate 34. The prongs 32 may be secured to the front plate 34 in a variety of ways. For example, the base of the prongs may fit over one or more of the posts 38 and may be sandwiched between the front plate 34 and the backplate 36. The prongs 32 are lower on the front plate 34 for the GFCI active cover plate 28 than on a standard outlet active cover plate because of the lower placement of the screw terminals 24 on the GFCI outlet 10. The two opposing prongs 32 may contact either the load or the line screw terminals 24 of a GFCI outlet 10, depending on the configuration of the specific GFCI outlet 10 and installation orientation of the active cover plate 28 with respect to the GFCI outlet 10. As discussed above, if the prongs 32 contact the line screw terminals 24, an active cover plate 28 may draw electrical power from the house wiring 12 and may operate regardless of whether the GFCI is tripped. If the prongs 32 contact the load screw terminals 24, an active cover plate 28 may not have power when the GFCI outlet 10 is tripped.

FIG. 2E shows a side view of an active cover plate 28. From the side, the structure of the GFCI prongs 32 shows that the prongs may be generally straight and extend from the front plate 34 in a perpendicular manner. However, this is only one example. The prongs 32 may have a variety of other configurations. For example, the prongs 32 may extend from the front plate 34 at any angle, including angles that bring the tips of the prongs 32 toward each other.

FIG. 2F shows a bottom view of an active cover plate 28 and prongs 32 that extend rearward off the front plate 34. The prongs 32 may include back element(s) 40, a main ramp 42 at the terminal end of the prongs 32, and front element(s) 44. In some embodiments, the back element(s) 40 and front element(s) may be insulative components. In this example, a free/terminal end of a resilient contact (near the base of a prong 32) may be sandwiched between a front element 44 and a rear element 40. The terminal end of the resilient contact may slide between these two insulative components 40, 44 to facilitate the compression of the bow as the corresponding prong 32 is insertion in the gap 20 between the edge of the GFCI outlet 10 and the outlet box 22 and its subsequent re-expansion to contact the screw 24.

As shown in FIG. 2F, each of the prongs 32 may include a resilient contact 46 (in this illustrative embodiment the resilient contact can be described as a resilient bowed contact) and an auxiliary spring 48 (e.g. a cantilevered spring) beneath the resilient contact 46. The resilient contact 46 may compress during insertion of the prongs 32 between the body of the GFCI outlet 10 and sides of the electrical receptacle box 22. This results in a prong 32 that can pass through very thin/narrow openings/gaps. The contact 46 then expands/rebounds when the prong 32 reaches the recessed area containing the screw terminals 24 or other area with greater width.

The spring 48 may assist the contact 46 in expanding by providing additional force on the rear of the resilient contact 46. This may assist in bringing the contact 46 inward, increasing the width of the prong 32, and makes an electrical connection between the contact 46 and the screw terminal 24. The spring 48 may or may not be present in a particular design. In general, the contact 46 may contain sufficient resilient force to rebound after compression.

Figures 2G, 2H:
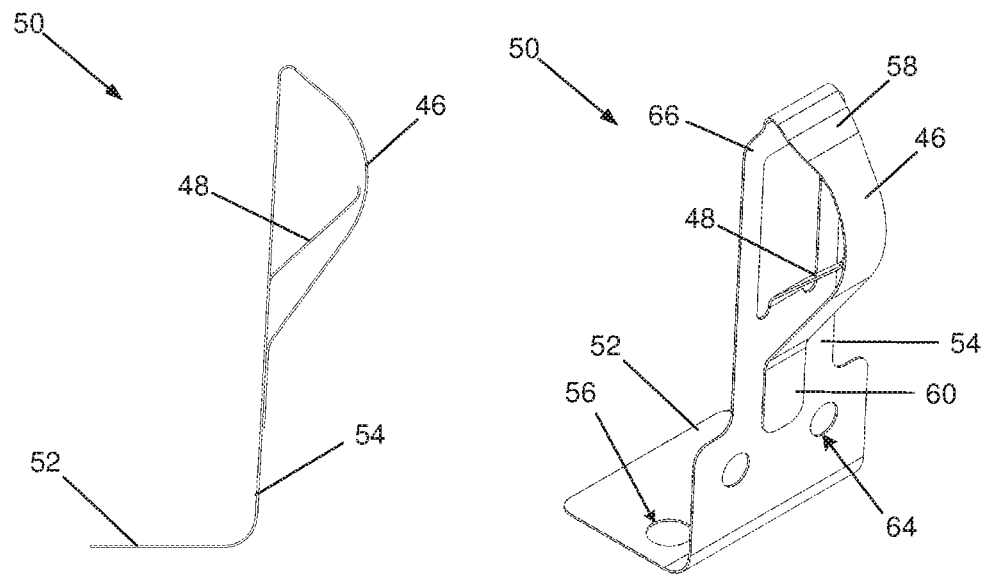
Figure 2I:
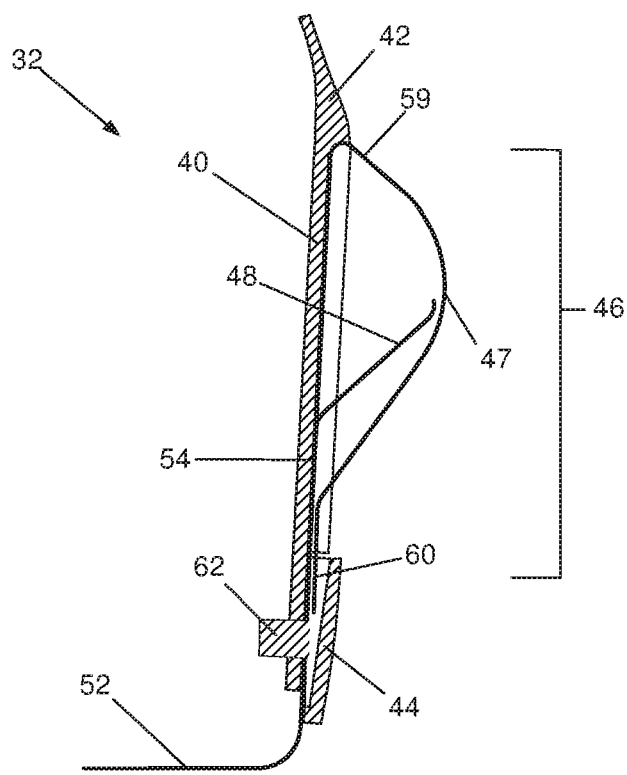

FIGS. 2G, 2H, and 2I show one embodiment of a metal clip 50 that can be incorporated into a prong and may be configured to provide resilience, electrical conductivity, and a contact 46 for a prong 32. FIG. 2G is a side view of the metal clip 50, showing the base 52, upright 54, and resilient contact 46. The spring 48 is also shown. FIG. 2H shows a perspective view of the metal clip 50. In this example, the base 52 of the metal clip 50 has apertures 56 that are configured to fit over posts 38 that extend from the rear of the front plate 34. The base 52 may also be secured by sandwiching it between the front plate 34 and the back plate 36.

The upright portion 54 is configured to support the prong 32 and resiliently flex when forces are applied to the prong. For example, the flexure in the upright 54 may be configured to allow the prongs 32 to bend outward when placed over a receptacle 10 that is wider than spacing between the two opposing resilient contacts 46. The flexure and resiliency in the upright 54 then urges the prong 32 inward so that the contact 46 is brought into electrical and mechanical contact with the screw terminal 24 of the GFCI outlet receptacle 10. The upright 54 may or may not be metal or conductive. In some embodiments, the upright may be formed from plastic or other material.

The contact 46 of the metal clip 50 may be formed by bending an extension 58 from the top of the upright 54 into a desired shape. For an example of an unbent prong with an extension 58, see FIG. 9A. In this example, the extension 58 is bent near its base and the extension 58 curves to form the rounded resilient contact 46 and place the end 60 of the extension 58 against a lower portion upright 54. As discussed elsewhere in the present paper, in this embodiment, the end 60 can be configured to slide back and forth against the upright 54 as the curvature of the contact 46 changes, thereby increasing/decreasing the overall width of the prong 32.

Thus, the prong 32 may be connected to the back surface 33 of the front plate 34 at a location outboard of the outlet aperture 30 and extend rearward away from the back surface 33 of the front plate 34 in the transverse direction. The prong 32 may include an upright 54 extending rearward away from the back surface 33 of the front plate 34 in the transverse direction and a resilient contact 46 located on an inboard side of the upright 54.

FIG. 2I shows insulating back element 40 and insulating front element 44 over a metal clip 50. The outboard/back element 40 covers the rear of the metal clip 50 and the top curve of the resilient contact 46. The front element 44 covers the bottom/end 60 of the extension 58 and has two posts 62 that extend through corresponding apertures 64 in the upright 54 and apertures in the back element 40. These posts 62 may be compressed to secure the back and front elements 40, 44 in place on the metal clip 50. The rear element 40 may also be secured by having shoulders 66 on the metal clip 50 slide into slots in the rear element 40. In this example, the rear element 40 includes a ramp 42. Both the front and rear elements in this example may be insulating.

Thus, as illustrated in FIG. 2I, a resilient contact 46 may include a first end 59, second end 60, and middle portion 47. The first end 59 and second end 60 may contact the upright 54 while the middle portion 47 extends inboard and away from the upright 54. One of more of the ends 59, 60 may be free to move with respect to the upright 54. In the example shown in FIG. 2I, the first end 59 is connected to the upright and the second end 60 is free to move with respect to the upright 54. In other prong embodiments shown below, the prongs may have other configurations, with both ends of the contact being free to move or the end of the contact extending farthest away from the base of the prong may be free to move instead of the end closer to the base.

In some embodiments, the prong 32 may further comprise a front element 44 covering at least a portion of the inboard side of the upright 54. The second end 60 of the contact 46 may be captured between the front element 44 and the inboard side of the upright 54 such that the second end 60 has a greater freedom of motion in the transverse direction than in the lateral direction or the longitudinal direction.

The examples discussed above are only illustrative. The principles described may take a variety of different forms and be combined with other principles or features described herein. For example, the prongs 32 and/or metal clips 50 described in FIGS. 2J and 2K may have different geometric implementations than other prongs than incorporate the principles described herein. For other examples of prongs with different geometries see FIGS. 5, 6, 7, 8, 9, 10, 11. The prongs 32 are not limited to any specific embodiment shown, but can have a wide range of implementations of the principles described.

As discussed above, various models of GFCI outlets 10 may have different setback distances 26 from the mount. Consequently, the prongs 32 extending rearward from the front plate 34 of an active cover plate 28 may have various lengths or contact configurations to contact a wider range of GFCI outlets 10. One approach to contacting screw terminals 24 with different setback distances 26 is to make prongs 32 with two different heights 68.

Figure 2J:
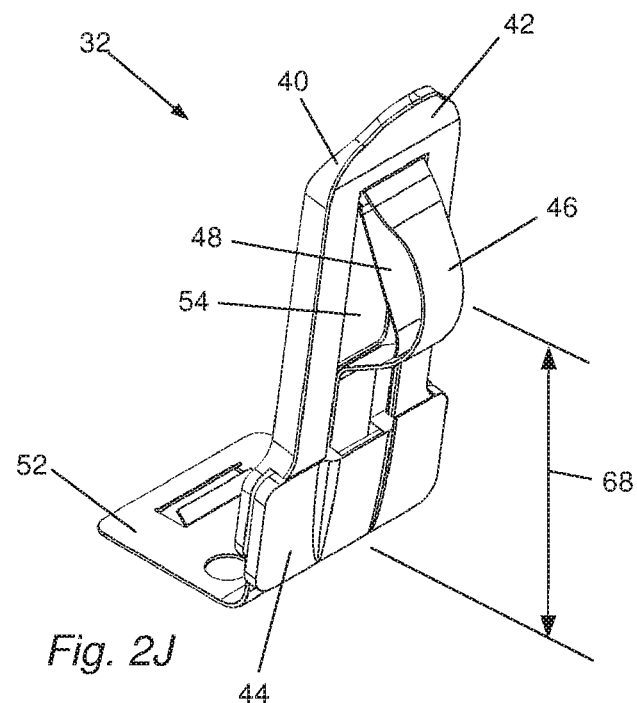
Figure 2K:
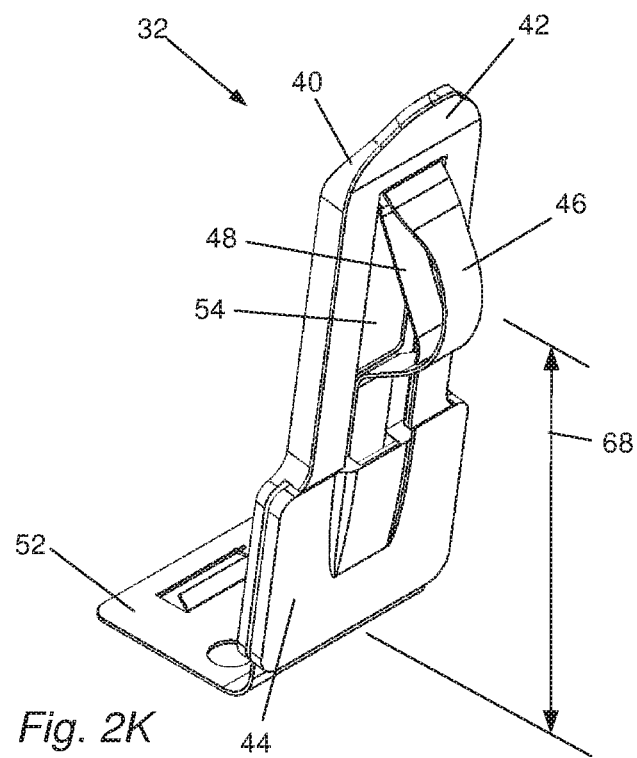

If a particular GFCI outlet 10 has screws 24 that are setback farther than other GFCI outlets 10, a taller prong 32 may be used to reach farther into the GFCI electrical outlet receptacle box 22 to reach the screw terminal 24. FIG. 2J shows a shorter GFCI prong 32. FIG. 2K shows a longer GFCI prong 32. Also shown in FIGS. 2J and 2K are cantilever springs 48 that extend from an upper portion of an upright 54 rather than from a lower portion of an upright 54 as shown in FIGS. 2B, 2C, 2F, and 2G-2I.

FIGS. 2J and 2K also show the resilient contacts 46, the uprights 54, the front element(s) 44 and rear element (4) with terminal ramps 42. The bases 52 may include a number of features to retain the prong on the face plate and to make an electrical connection with circuitry that is included in the active cover plate. For example, conductive material may connect the resilient contact to the electronic circuitry. In this example wires may connect to the base of the prong and then to a circuit board sandwiched between the front plate and back plate. However, the prongs, circuitry and the method of connecting the circuitry to the prongs may vary in other embodiments. For example, the prong may have an integral extension of metal that connects to the circuit. Additionally or alternatively, the resilient contact may be conductive while other elements, such as the upright 54 may not be conductive. A wire or other conductive element may connect directly to the contact and the circuit. In some embodiments, the circuitry may include a light source such as LEDs.

FIG. 3A shows a rear view of a GFCI outlet 10 with an active cover plate 28 installed over the GFCI outlet 10. FIG. 3B shows a front view of the GFCI outlet 10 with the active cover plate 28 installed. FIG. 3C is a rear perspective view that shows a prong 32 extending along the side of the GFCI outlet 10, which enables a corresponding resilient contact 46 to extend into recesses 33 and contact an inset screw terminal 24.

In one example, an active cover plate 28 may include at least one prong 32 configured to contact a screw terminal 24 of an electrical receptacle 10. This prong 32 may include a front element 44 that may serve as insulator and/or bottom cover on the inboard side of prong 32 and back element 40 on the outboard side of the upright. The back element may have a number of functions including insulation, structural support, or other functions. The prong 32 also may include a resilient contact 46 (e.g. a bowed or resilient contact) extending beyond the front element 44 (e.g. bottom cover) to make contact with the screw terminal 24 of an electrical receptacle 10. The active cover plate 28 may include a circuit and an electrical connection between the at least one prong 32 and the circuit, wherein the at least one prong 32 may supply the circuit with electrical power from the screw terminal 24.

In one example, the resilient contact 46 (e.g. bowed contact) may compress under a normal or lateral force of less than 10 newtons to less than one quarter of its uncompressed height. The resilient contact 46 may also be secured between the front element 44 (e.g. insulating and/or bottom cover) and the back element 40 (e.g. insulating cover). Additionally or alternatively, the resilient contact 46 may be configured to compress to less than half of its uncompressed height.

For example, the resilient contact 46 may be configured to be compressed to less than half of its uncompressed height under manual pressure during installation of the active cover plate 28 over an electrical receptacle 10. In some embodiments, the resilient contact 46 may be configured to rebound to at least 80% of its original height after being compress to half of its uncompressed height.

Figure 4A:
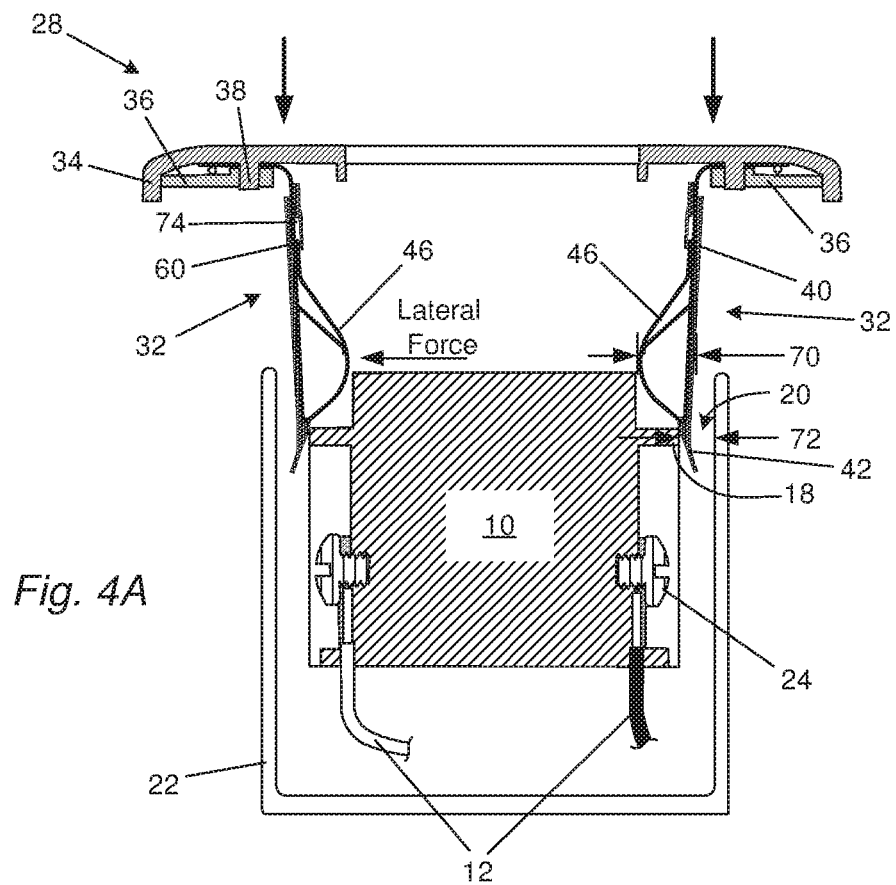
FIGS. 4A-4D are diagrams showing installation of a GFCI active cover plate over a GFCI outlet, according to one embodiment of principles described herein.

FIGS. 4A-4D are diagrams that show various illustrative stages of an installation and removal of an active cover plate 28 over a GFCI outlet 10. In FIG. 4A the active cover plate 28 with its prongs 32 extending rearward has been placed over the GFCI outlet 10 so that there is one prong 32 on either side of the GFCI outlet 10. The prongs 32 in this example are secured between the front plate 34 and back plate 36 with posts 38 extending through the base of the prongs. Electrical power to the GFCI outlet 10 is supplied through wires 12 that are connected by screw terminals 24.

As shown, the width 70 of the prong 32 exceeds the width 72 of the narrow gap 20 between the body of the GFCI outlet 10 and the electrical box 22. In this case a shoulder 18 on the GFCI outlet 10 protrudes to create the narrowest portion of the gap 20. In this embodiment, the prong 32 must compress to pass through the gap 20. However, in other embodiments the prong 32 may flex or contract to pass through the gap 20.

In this embodiment, the prongs 32 also include a main ramp 42 that is configured to engage with the body of the GFCI outlet 10 and guide the prongs 32 around the GFCI outlet 10. However, in other designs, the ramp 42 may be configured to engage with the electrical box 22 and have an incline in the other direction. For example, the prongs 32 in FIGS. 2J and 2K have ramps that are inclined in the opposite direction of those shown in FIGS. 4A-4D. Before the contacts 46 begin to enter the gap 20, the end 60 of the contact 46 does not extend all the way into the cavity 74 between the outboard insulation/rear element 40 and the inboard insulation/front element 44. This leaves space in the cavity 74.

Figure 4B:
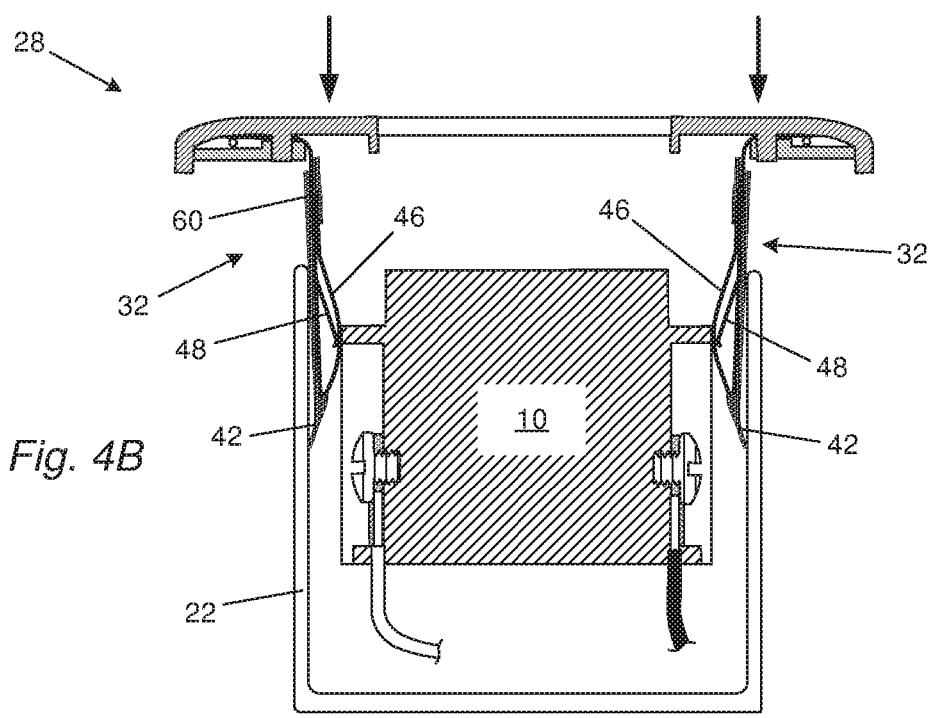

FIG. 4B shows the active cover plate 28 being installed over the GFCI outlet 10 and the prongs 32 compressing to enter the narrow gap 20. The free end 60 of the contact 46 extends into the cavity 74, FIG. 4A and allows the face/profile of the contact 46 to straighten, thereby narrowing the overall width 70 of the prong 32. The auxiliary spring 48 also bends, thereby allowing the overall width 70 of the prong 32 to narrow. Also, the back of the prong 32 is in contact with the inner wall of the electrical box 22. In this example, the main ramp 42 is in contact with the inner wall of the electrical box 22 as well.

Figure 4C:
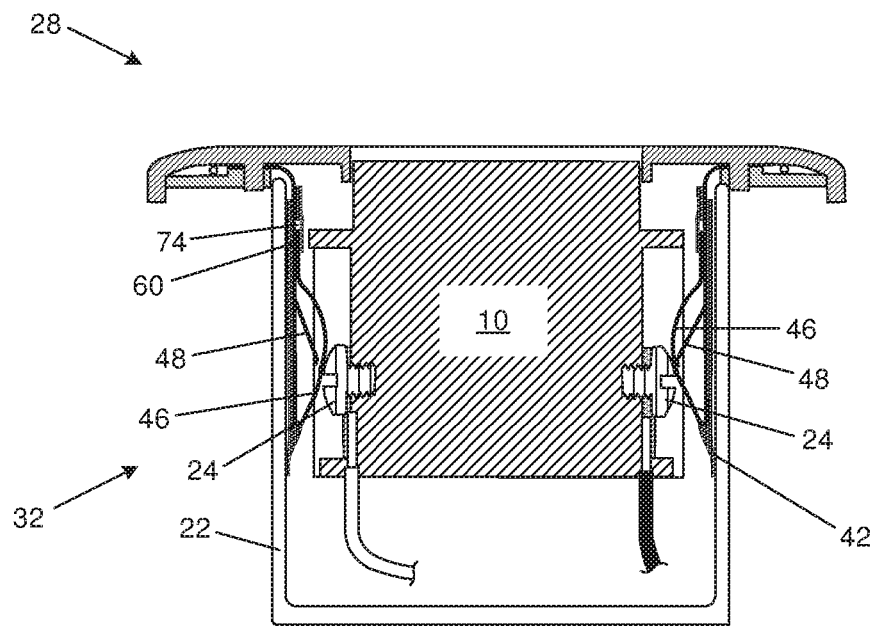
Figure 4D:
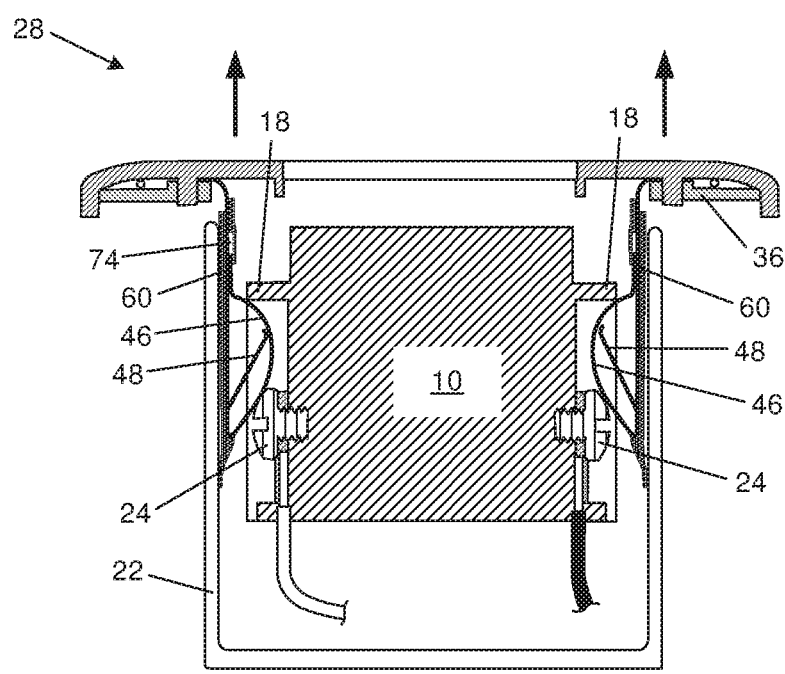

FIG. 4C shows the active cover plate 28 in place over the GFCI outlet 10 and the free end 60 of the contact 46 retracting out of the cavity 74 and the contact 46 rebounding/recovering its width 70 after passing through the gap 20 to contact the screw terminal 24. The auxiliary spring 48 may provide some portion of the recovery force to assist the contact 46 in recovering. However, there are embodiments of the GFCI prongs 32 that do not include the auxiliary spring 48 or the auxiliary spring 48 may have a different geometry. For example, the auxiliary spring 48 may be a cantilever spring as shown in FIG. 4C or may have a different geometry as shown in FIG. 4D. The prong 32 may also have a variety of other auxiliary spring 48 types, sizes, and/or geometries that assist with rebound of the contact 46. For example, a compression spring may be under the contact 46 or may otherwise support the contact 46. In some embodiments, the front of the prong 32 may be in contact with the screw terminal 24 and at least a portion of the outboard side of the prong may be in contact with the inner wall of the box 22. For example, the ramp 42 and/or other portions of the prong may be in contact with the electrical box 22.

FIG. 4D shows removal of the active cover plate 28 from the GFCI outlet 10. In this configuration, friction between the contact 46 and the shoulder 18 of the GFCI outlet 10 may tend to prevent contact 46 from being withdrawn. In some embodiments, this may tend to pull the terminal end 60 of the contact 46 out of the cavity 74 and to bunch up the contact 46 rather than having it collapse and narrow to pass through the gap. To mitigate this, the free end 60 of the contact 46 may be captured in the cavity 74 to prevent the end 60 of the contact 46 from being pulled from the cavity 74 during removal of the active cover plate 28. This concept is described in greater detail in FIGS. 5G-5I and associated text. The auxiliary spring 48 may have an additional purpose in that it may prevent the contact 46 from bunching up as the active cover plate is withdrawn.

As discussed above with respect to FIGS. 4A-4D, a first end of the resilient contact 46 may be secured with respect to the rear element 40 (e.g. insulating cover) and a second end of the resilient contact 46 may be configured to slide with respect to the rear element 40. The second end 60 of the resilient contact 46 may be configured to slide between the rear element 40 and the front element 44. The second end 60 of the resilient contact 46 may be configured to slide into a slot between the rear element 40 and the front element 44 when the contact 46 is compressed and to retract at least partway out of the slot when the contact 46 relaxes (see e.g. FIG. 4C). Additionally, the prong 32 may include an additional spring 48 configured to provide a restoring force to the resilient contact 46 to restore the height of the resilient contact 46 after compression. The spring 48 may be a cantilever spring 48 or other appropriate spring 48 configured to press against an underside of the resilient contact 46.

Figure 5B:
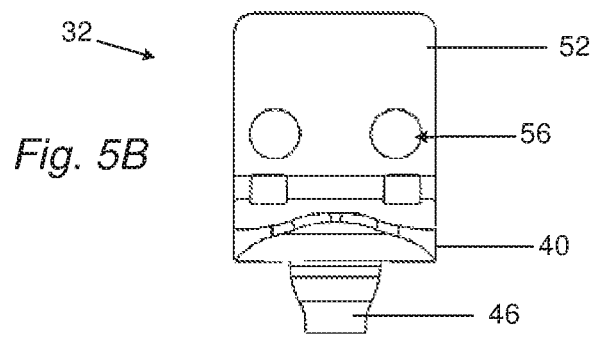
Figure 5A:
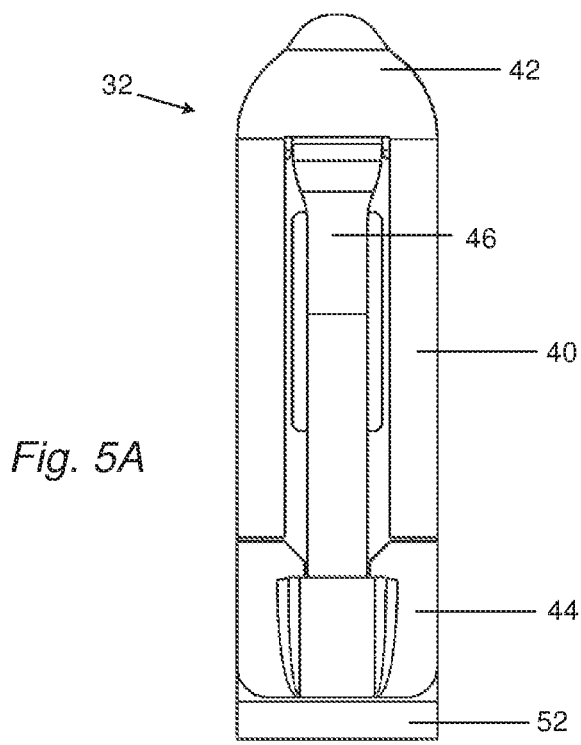

Prongs 32 in accordance with the present invention may have a number of features and benefits that are described with respect to FIGS. 5A-5F. FIG. 5A is a front view of a prong 32 showing the base 52, a bottom cover 44, a contact 46, a rear element 40, which acts as an insulating cover, extending upward from the base 52 and supporting the contact 46 and main ramp 42 extending from or as part of the rear element 40.

FIG. 5B is a top view of the prong 32 with the contact 46 extending/bowing outward from the insulating cover 40. The base 52 is shown with securing elements formed therein. In this example, the securing elements are apertures 56 that are configured to accept mounting posts such as mounting posts 38 shown in FIGS. 2D-2F.

Figure 5C:
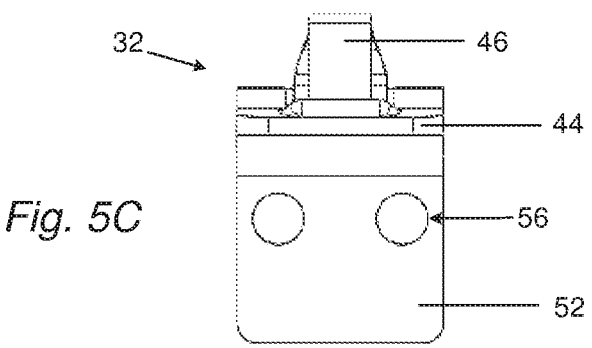

FIG. 5C shows a bottom view of the prong 32 with the contact 46, bottom/front cover 44 and base 52. As a force is applied (during insertion of the prong 32 between the GFCI outlet 10 and the receptacle box 22), the contact 46 may compress by sliding one end 60 further into the bottom cover 44. This allows the ends of the contact 46 to move away from each other and for the contact 46 to collapse or flatten. When the force is removed (i.e. the prong 32 reaches the side of the GFCI outlet 10 where the screw terminal 24 is located), the auxiliary spring 48 may assist the contact 46 in resiliently springing back to contact the often recessed screw terminal 24.

FIG. 5D shows a spring 48, contact 46 and base 52. In one embodiment, the base 52, spring 48 and contact 46 may all be stamped/formed from the same piece of resilient sheet metal. The bottom/terminal end 60 of the contact 46 may slide in a pocket, space, and/or cavity in the front element 44. This allows the bowed contact to compress to have a flatter profile. The front element 44 may be connected to the rear element 40 in this example by two joining posts 62. However, this and other connections could be made in a variety of different ways. FIG. 5F shows a perspective view of a prong 32.

Figure 5G:
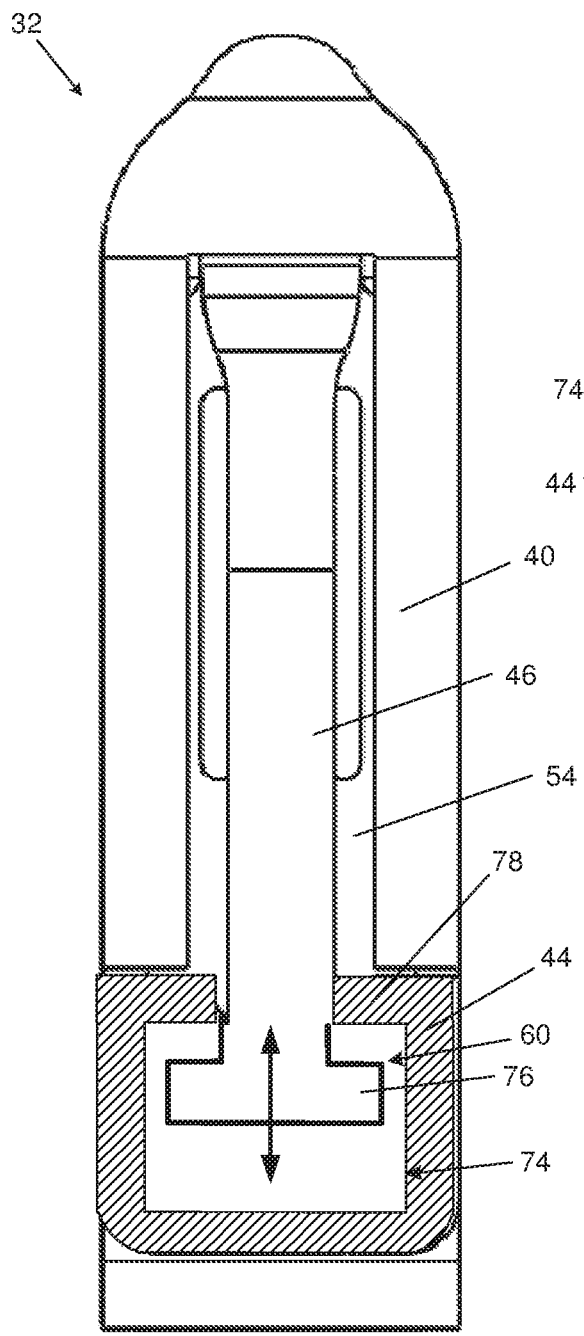
Figure 5H:
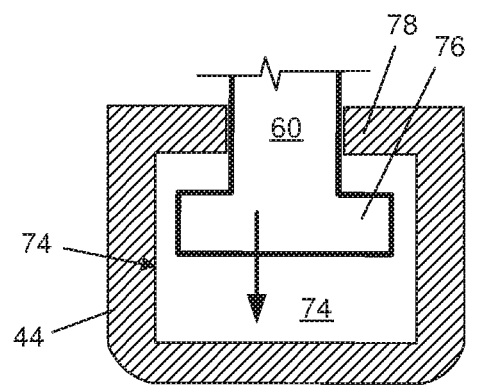
Figure 5I:
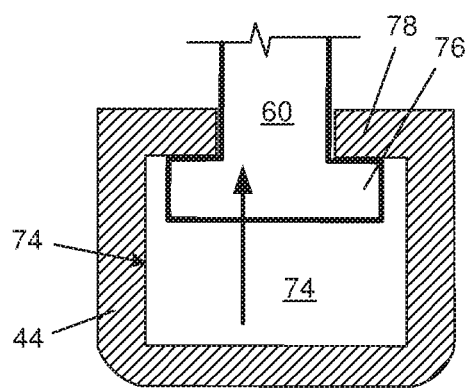

FIGS. 5G-5I show a prong 32 that includes end-capture of the contact 46. FIG. 5G shows a front view of the prong 32 with the front element 44 partially cut away to show the end 60 of the contact 46 captured within the cavity 74. FIG. 5H shows that during compression, the end 60 of the contact 46 extends further into the cavity 74 and during expansion of the contact 46 (i.e. retraction of the prong) the end 60 (e.g. a retention feature 76 of the end 60) contacts a blocking feature 78 to prevent the end 60 of the contact 46 from leaving the cavity 74. FIG. 5I shows that during expansion or retraction of the prong 32 the blocking feature 78 contacts the retention feature 76 and prevents the end 60 of the contact 46 from leaving or being pulled out of the cavity 74.

In some situations, there may be different GFCI outlet 10 configurations that have such different geometries that it could be difficult for a single prong 32 to contact the full range of GFCI outlets 10 and outlet configurations. For example, the GFCI outlet 10 may be installed upside down or right side up. If the screw terminals 24 are symmetrical, then the same prong 32 in the same position would contact the screw terminals 24 in both orientations. However, if the screw terminals 24 were not symmetrical about a midpoint of the outlet 10, then the prong 32 may not be able to contact the screw terminal 24 in one of the configurations.

Additionally, the GFCI outlets 10 may have screw terminals 24 at a range of depths. Some screw terminals 24 may be a shorter distance from the face of the outlet 10, while others may be a greater distance from the face of the outlet 10. Additionally, sometimes a GFCI cover plate is installed so that the front surface of the GFCI outlet 10 is flush with the front surface of the cover plate. In other situations, the GFCI outlet 10 may extend as much as a ¼ of an inch beyond the front surface of the cover plate. This means that there may be variation of as much as a quarter inch in the depth or location of the screw terminal 24 with respect to the active cover plate 28 based solely on the way the GFCI outlet 10 is installed.

Figure 6A:
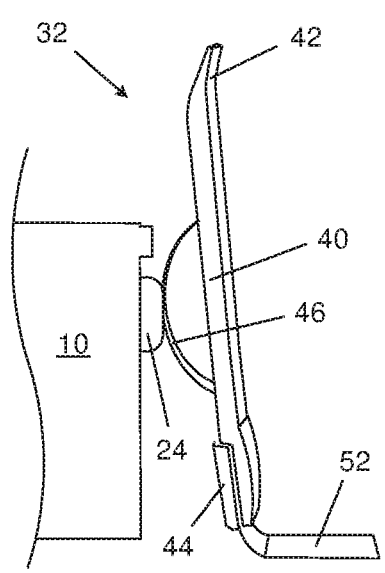
FIGS. 6A-6I are diagrams of illustrative GFCI prongs with adjustable contact positions, according to one example of principles described herein.

FIGS. 6A-6I are diagrams showing prongs 32 with contacts 46 that can be moved to better contact screw terminals 24 with varying depths. FIG. 6A shows a prong 32 with a contact 32 in a lower position. The contact 46 is touching some part of a screw terminal 24 (in this case a screw head of a GFCI outlet 10, although it could be touching any other electrified surface of any type of electrical receptacle).

Figure 6B:
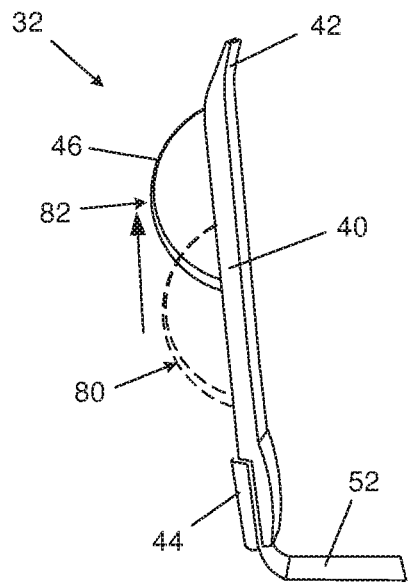
Figure 6C:
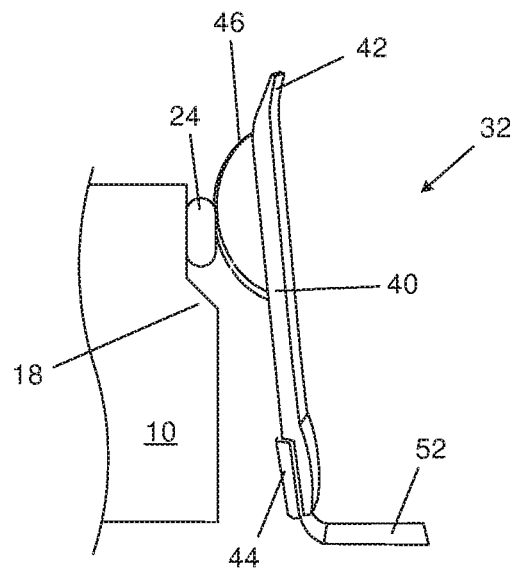

As discussed above it can be desirable for the same prong 32 to be configured to contact a wide range of electrical receptacles 10, including electrical receptacles 10 that have screw terminals 24 that are deeper into an electrical box 22 (i.e. see FIG. 6C where the recessed screw terminal 24 is farther from the base 52 of the prong 32). FIG. 6B shows that the contact 46 can be moved from one position 80 (for shallow terminals) to another position 82 (for deeper terminals). FIG. 6C shows the contact 46 in a position 82 suitable for contacting a recessed screw terminal 24 while avoiding a shoulder 18 of the GFCI outlet 10.

The prong 32 may be configured in a variety of ways to allow the contact 46 to be moved from one position 80 to another position 82. For example, the contact 46 may be a separate piece and "float" while still remaining captured. The contact 46 may be formed from metal and move up and down/in and out in a conductive track in the face of the prong 32. This may allow for motion of the contact 46 while still maintaining electrical conductivity between the contact 46 and other conductors in the prong 32.

Figure 6D:
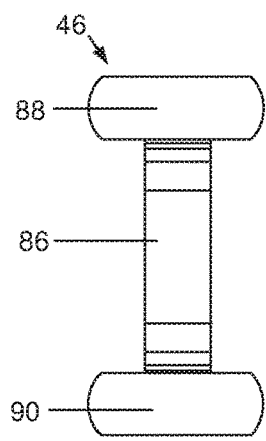

FIGS. 6D-6I show one embodiment of a mechanism that may allow a position of a contact 46 on the face 84 of a prong 32 to be adjusted. FIG. 6D shows an illustrative contact 46 and a prong face 84 that allow for the contact 46 to be moved and "locked" into place. In this example, the contact 46 may include a convex contact portion 86, an upper base 88 and a lower base 90. The contact 46 may be formed in a variety of ways and from a variety of materials. For example, the contact 46 may be formed from a conductive sheet and stamped into the desired shape/geometry.

Figure 6E:
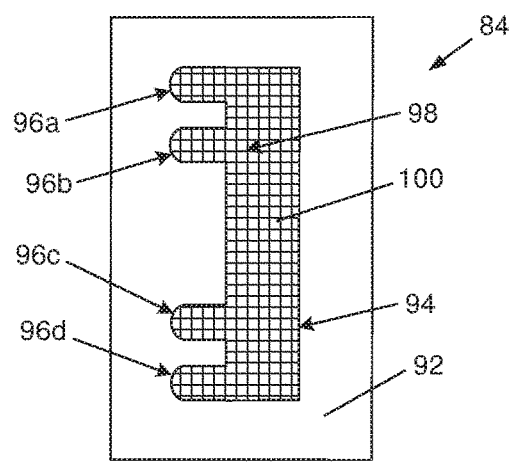

FIG. 6E shows a face 84 of a prong 32 that includes an outer layer 92 with an aperture 94. The aperture 94 may include four slots 96a, 96b, 96c, 96d spaced along one side 98, two upper slots 96a, 96c with the same spacing as the upper and lower bases 88, 90 of the contact 46 and two lower slots 96b, 96d, also with the same spacing as the upper and lower bases 88, 90 of the contact 46. The aperture 94 may be backed by an inner layer 100. The outer layer 92 (e.g., front insulation element 44) and inner layer 100 may be formed from a variety of materials including conductive and nonconductive materials. In one example, both the outer and inner layers 92, 100 are formed from conductive metal. In other embodiments the outer layer 92 is an insulator and the inner layer 100 is a conductor.

Figure 6F:
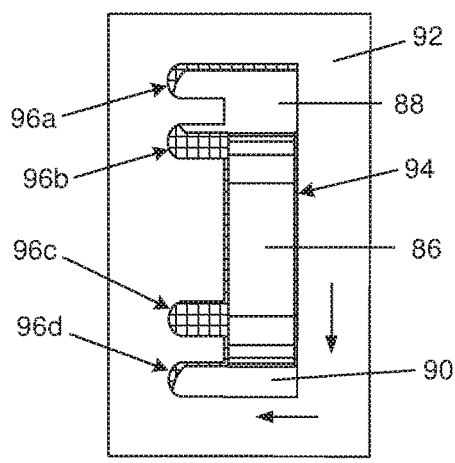

FIG. 6F shows the contact 46 in place in the face 84 of the prong 32, with the upper and lower bases 88, 90 sandwiched between the inner and outer layers 100, 92 and the convex contact portion 86 extending away from the face 84 of the prong 32 (toward the viewer). By moving the contact 46 down and to the left into the lower set of slots 96b, 96d, the contact 46 may be secured in a lower position 80, with the slots 96b, 96d preventing the contact 46 from moving vertically.

Figure 6H:
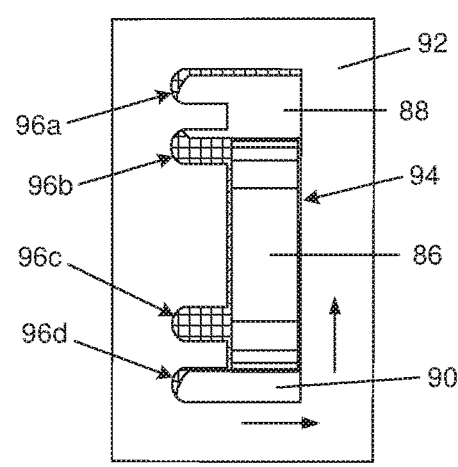
Figure 6G:
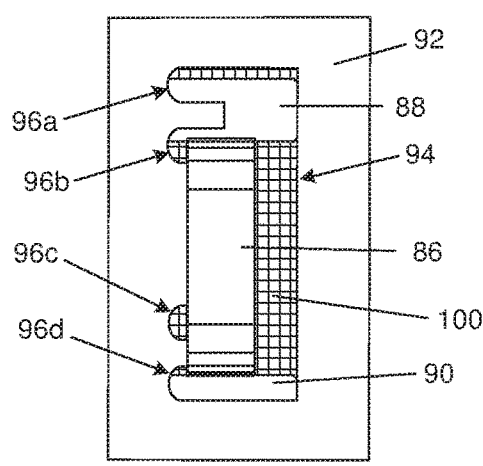
Figure 6I:
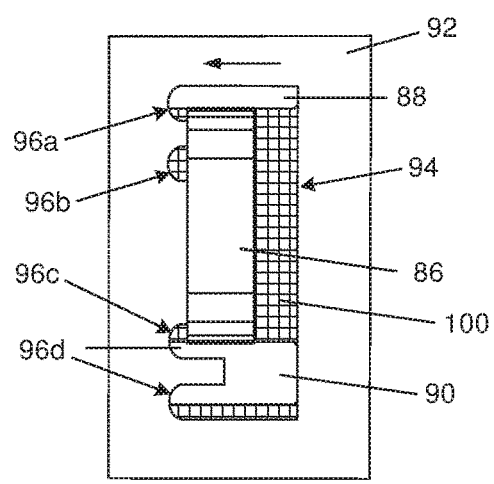

The upper and lower bases 88, 90 may be sandwiched between the inner and outer layers 100, 92 and are in electrical contact with at least one of the layers 92, 100 that is conductive. This allows for an electrical path from the contact 46 through the prong 32. FIG. 6G shows the contact 46 locked into position in the two lower slots 96b, 96d. However, the contact 46 may still be able to compress because one or more of the ends may be able to slide (e.g. in the slots 96b, 96d) to flatten an arch formed by the convex contact portion 86. Conversely, if the contact 46 is moved up and to the left as shown in FIG. 6H, the contact 46 may be locked or secured in an upper position 82 in the face 84 of the prong 32 as shown in FIG. 6I.

The description given above is only one example. There are many different embodiments of the contact 46 and prong 32 that could be used to make the position of a contact 46 adjustable on the face 84 of the prong 32. The principles described above can be combined with other principles, features, and descriptions in this document or documents that are incorporated by reference.

Figure 7A:
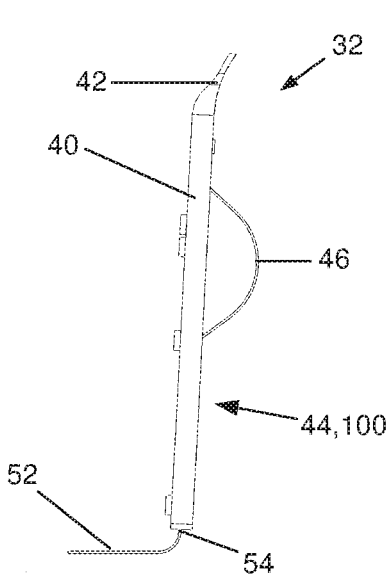
FIGS. 7A-7D are diagrams of illustrative GFCI prongs with adjustable contact positions, according to one example of principles described herein.
Figure 7B:
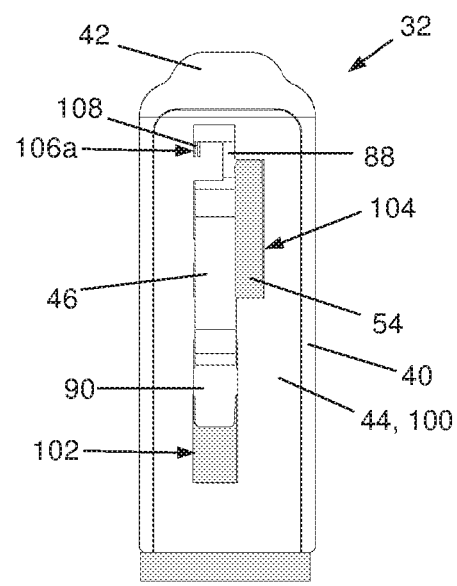
Figure 7C:
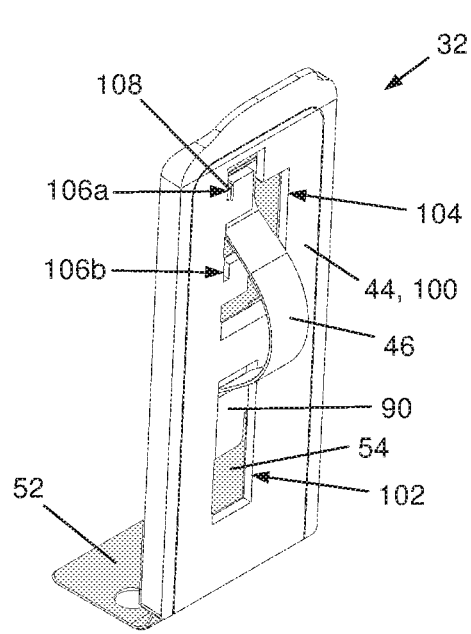
Figure 7D:
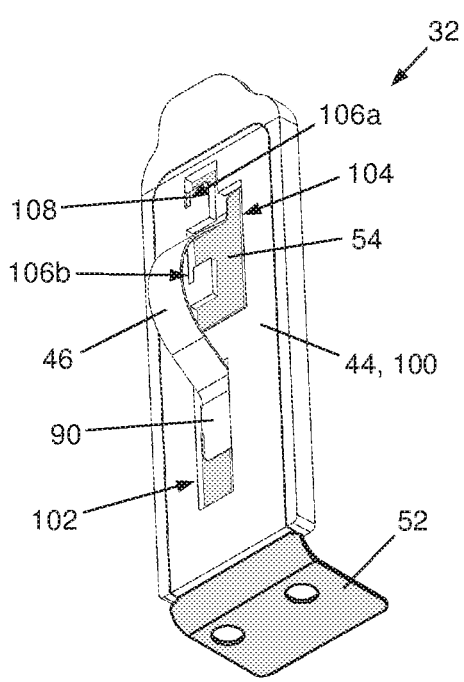

FIGS. 7A-7D show another illustrative embodiment of a prong 32 with a movable contact 46. FIG. 7A is a side view of the prong 32, showing the base 52 of the prong 52, an upright 54 extending at an angle from the base 52 and a ramp 42 at the distal end of the upright 54. A movable contact 46 extends from the inboard face 84 of the prong 32. FIG. 7B is a front view (of the inboard side of the prong 32) that shows the resilient contact 46 and the upright 54 at least partially covered by insulative material 40, 44. FIG. 7C is an upper perspective view of the prong 32 and FIG. 7D is a lower perspective view of the prong 32.

In this embodiment, the contact 46 has a lower base 90 and upper base 88 that are captured between an outer layer 92 (e.g., front insulation 44) and an upright 54. The lower base 90 may slide vertically within a lower aperture 102 or slot 102 in the outer layer 92. The upper base 88 may also slide within an upper aperture 104 in the outer layer 92. However, the upper aperture 104 in the outer layer 92 may have a number of locking features 106a, 106b that are configured to secure the upper base 88 in at least two vertical positions.

By securing only the top of the contact 46 (the upper base 88), the bottom base 90 may be free to slide within the lower aperture 102 to allow the contact 46 to compress/flex to pass through restricted locations such as narrow gaps 20 between GFCI outlets 10 and electrical boxes 22. In one embodiment, the upper base 88 has a tooth 108 that selectively engages the locking features 106a, 106b of the upper aperture 104 in the outer layer 92. Accordingly, the tooth 108 may engage or reside within an upper locking feature 106a when the corresponding contact 46 is in a more distal position with respect to the base 52 and may engage or reside within a lower locking feature 106b when the corresponding contact 46 is in a more proximal position with respect to the base 52.

Figure 8A:
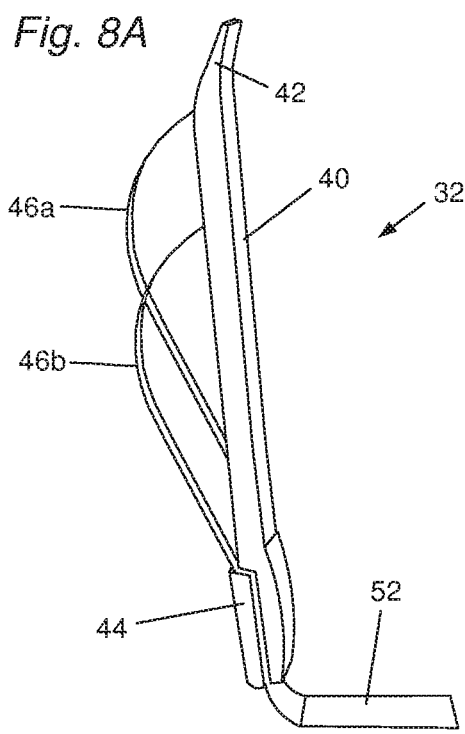
FIGS. 8A-8E are examples of illustrative GFCI prongs with dual contacts for a GFCI active cover plate, according to one example of principles described herein.

FIGS. 8A-8E show several illustrative examples of prongs 32 that have multiple contacts 46 to accommodate a wider range of variations in GFCI outlets 10. FIG. 8A is a side view of a prong 32 that includes an insulating rear element 44, a base 52, a front element 44, and two resilient contacts 46 (e.g., a first contact 46a and a second contact 46b). In this embodiment, the first and second resilient contacts 46a, 46b are bowed contact that slide in cavities 74 in the lower cover/front element 44.

Figure 8B:
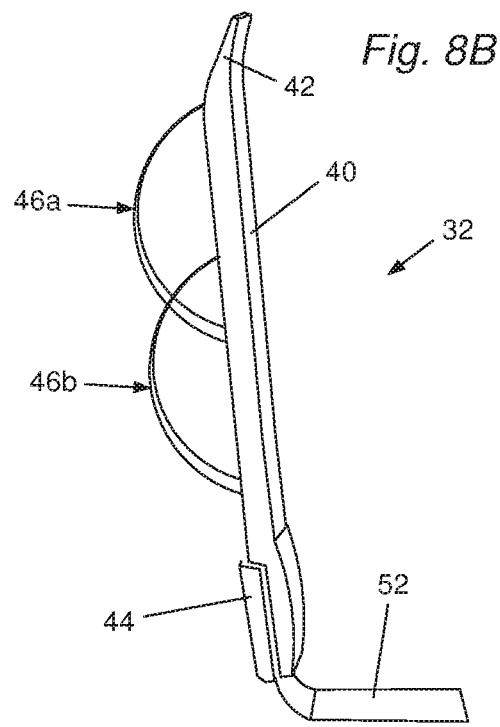
Figure 8C:
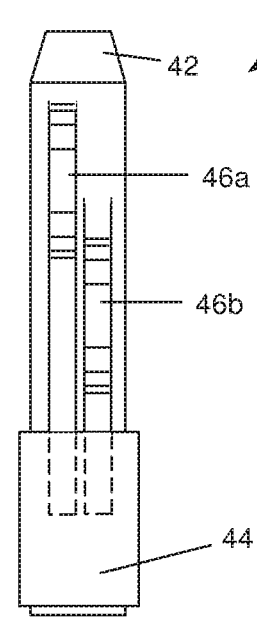
Figure 8D:
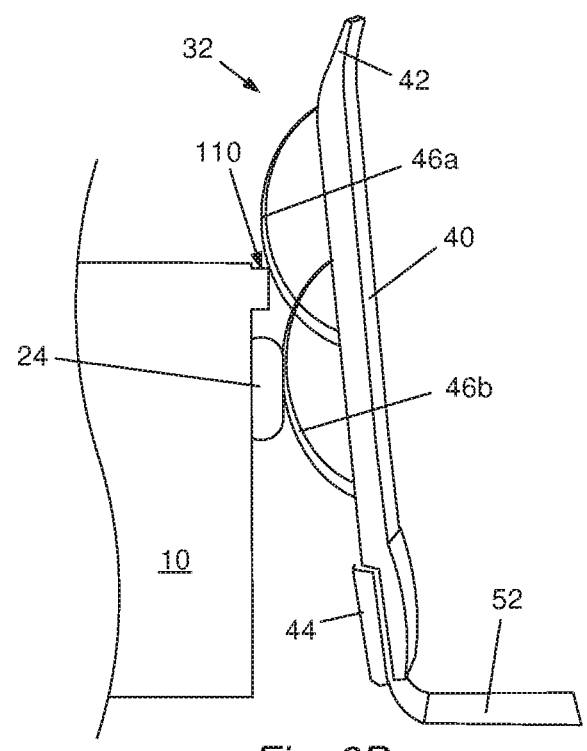
Figure 8E:
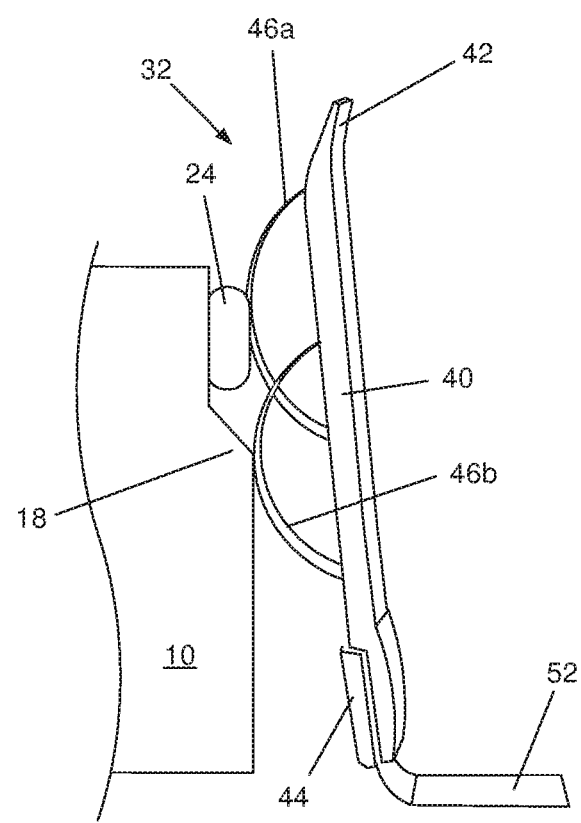

As shown in FIG. 8B, there are a number of shapes that the contacts 46 may have. In this figure, the contacts 46a, 46b are more rounded and protrude farther than the contacts 46a, 46b in FIG. 8A. FIG. 8C shows a front view of a prong 32, with the first contact 46a offset laterally and vertically from the second contact 46b. FIG. 8D shows a side view of a GFCI outlet with an obstruction above the screw.

In selected applications or situations, a single contact 46 may encounter an obstruction 110 and be lifted away from the screw terminal 24. However, with prongs 32 having multiple independent contacts 46 (i.e. a first contact 46a and a second contact 46b) the first contact 46a may independently contact the obstruction 110 while the second contact 46b may contact the screw terminal 24. Conversely, if there is a shoulder 18 or other obstruction on the GFCI outlet 10 as shown in FIG. 6C, the second contact 46b may engage with the shoulder 18 while the first contact 46a may engage with a recessed screw 24. Thus, the independence of the two contacts 46a, 46b provides for greater compatibility with a wider range of GFCI outlets 10 and outlet configurations.

Figure 9A:
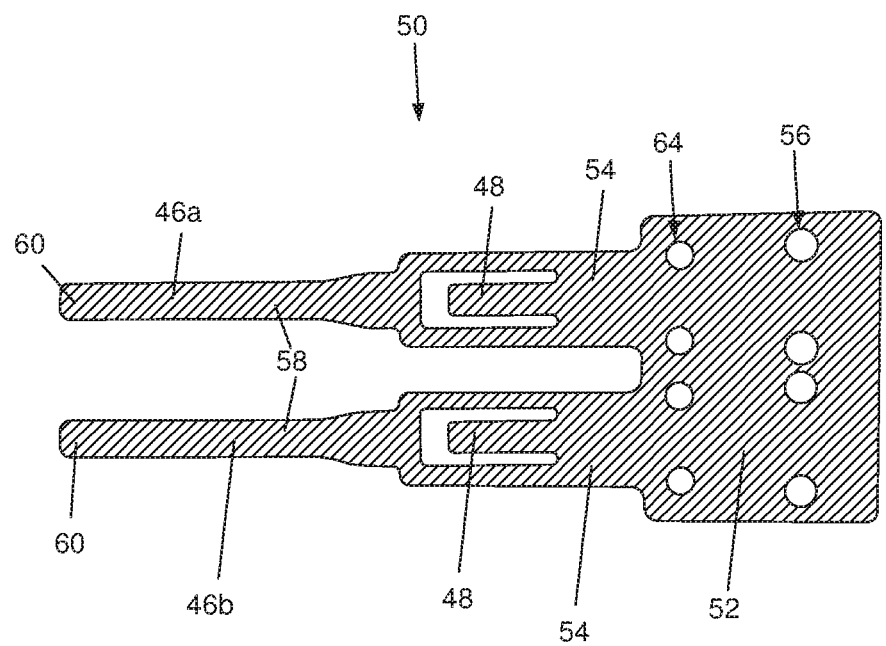
FIGS. 9A-9C are examples of illustrative dual GFCI prongs for a GFCI active cover plate, according to one example of principles described herein.
Figure 9B:
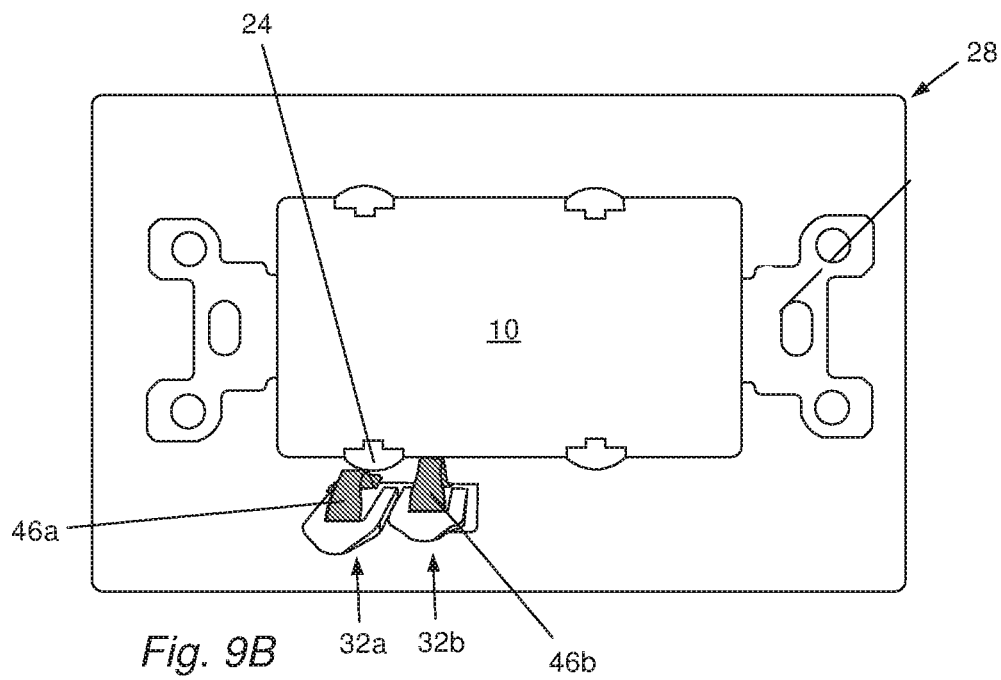
Figure 9C:
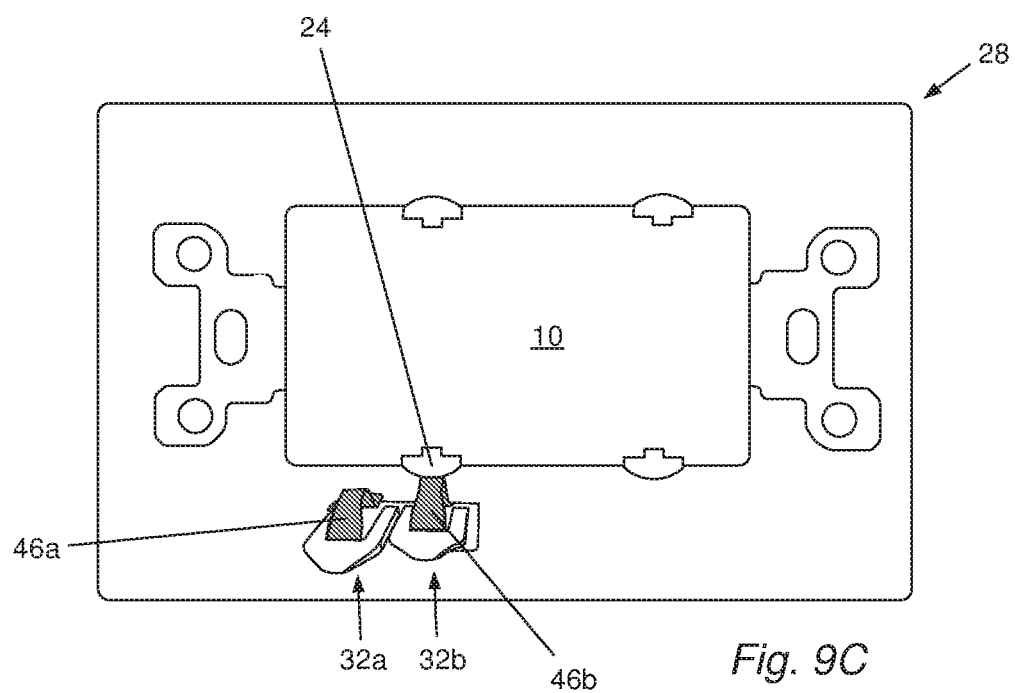

Thus, there may be one or more resilient contacts 46 (e.g. first and second contacts 46b, 46a as shown in FIGS. 8A-8E or dual contacts 46a, 46b corresponding to dual prongs 32a, 32b as shown in FIGS. 9A-9C). The first and second resilient contacts 46a, 46b may be vertically and laterally offset in the prong 32 (see e.g. FIGS. 8A-8E). In other examples, the first and second resilient contacts 46a, 46b may only be laterally offset in the prong 32 (see e.g. FIGS. 9A-9C and associated text). The first and second resilient contacts 46a, 46b may be only vertically offset in the prong 32, but not laterally offset. The first and second resilient contacts 46a, 46b may be able to compress independently. For example, the one of the resilient contacts 46a, 46b may be configured to compress or reform dependent on the compression of the other contact 46b, 46a.

FIGS. 9A-9C show an alternative configuration with double prongs 32a, 32b. FIG. 9A shows a metal clip 50 suitable for use with double prongs 32a, 32b. The metal clip 50 may begin as stamped or otherwise cutout sheet metal that has not yet been bent or formed. The metal clip 50 may include a base 52 with apertures 56 to both receive mounting post 38 and apertures 64 through which the joining posts 62 can pass to secure insulating elements 40, 44. Extensions 58 are formed to make the contacts 46a and 46b and their free ends 60. The portions that form the upright 54 and cantilevered sprint 48 are also labeled.

FIG. 9B shows double prongs 32a, 32b forming part of an active cover plate 28 that is installed over a GFCI outlet 10. In FIG. 9B, the active cover plate 28 with double prongs 32a, 32b is installed over a GFCI outlet 10 with the GFCI outlet 10 in a "right side up" orientation. The active cover plate 28 is shown without the back plate 36, circuitry, or other prongs 32 (prongs 32 for engaging the other side of the GFCI outlet 10). The first contact 46a of the double prongs 32a, 32b is contacting the screw terminal 24, while the second contact 46b is not contacting the screw terminal.

FIG. 9C shows an active cover plate 28 with double prongs 32a, 32b installed over a GFCI outlet 10 with the GFCI outlet 10 in an "upside down" orientation. In this example, the GFCI outlet 10 is not symmetrical. Consequently, the second bowed contact 46b makes contact with the screw terminal 24 instead of the first bowed contact 46a. Thus the double prongs may increase the compatibility of the active cover plate 28 with a wider variety of outlets and outlet configurations.

Figure 10A:
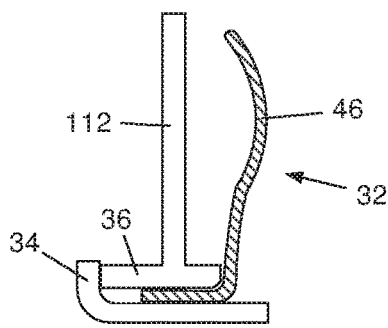
FIGS. 10A-10G show various illustrative examples of prongs for a GFCI active cover plate, according to one example of principles described herein.

FIGS. 10A-10G show various examples of principles or features that may be applied to prongs 32 for GFCI outlets 10 or other situations where prongs 32 need to pass through narrow openings and then expand to make electrical contact with elements beyond the narrow opening. FIG. 10A shows a resilient conductive plastic or metal prong 32 that may or may not be paired with an insulator (in this case a separate insulating wall 112) on the outboard side of the prong 32. The conductive prong 32 may have a fairly narrow profile and be flexible enough to compress to pass through a narrow opening.

Figure 10B:
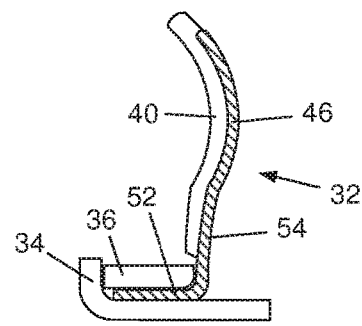

FIG. 10B shows a flexible prong 32 with a rear element/insulator 40 coupled to its outboard side. For example, the flexible prong 32 may be formed by dual injection molding. First a conductive plastic may injected to form the base 52, upright 54 and contact portions 46. The insulating plastic 40 on the upper and outboard sides of the conductive plastic could then be formed. Additionally or alternatively, the conductive plastic could be partially or completely replaced with flexible metal.

Figure 10C:
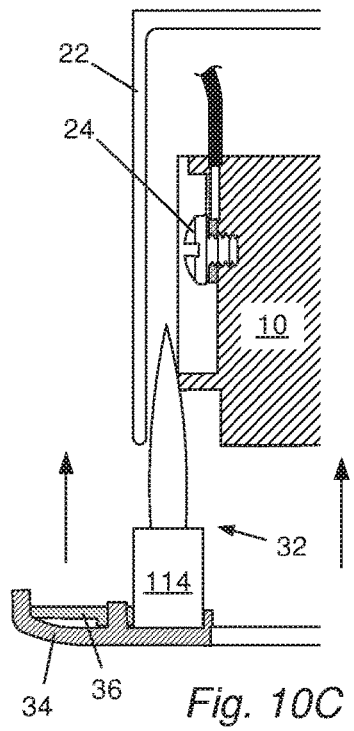
Figure 10D:
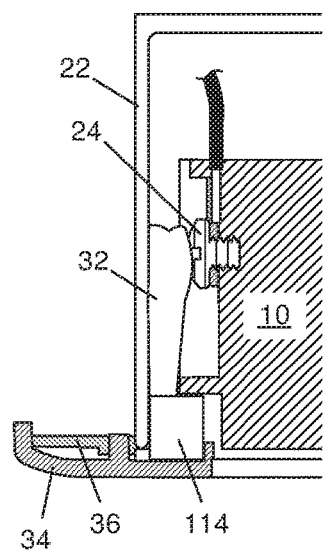

FIGS. 10C and 10D show a prong 32 that has an internal structure that expands after the active cover plate 28 is installed. For example, the prong 32 may include a base element 114 that is compressed as the active cover plate 28 is installed over the electrical receptacle 10. As the base element 114 is compressed, it may expand, broaden, alter the shape, or the like of a distal end of the prong 32 so that the prong 32 is brought into contact with the screw terminal 24. The front plate 34 and back plate 36 are shown in each of the embodiments.

Figure 10E:
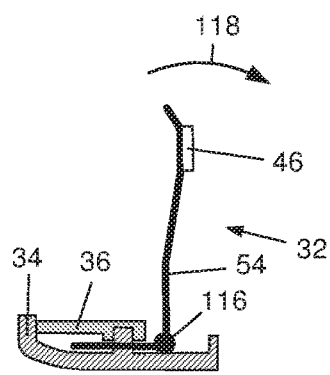

FIG. 10E shows a prong with a spring or resilient joint 116 between the base 52 the upright 54. The spring or resilient joint 116 may urge the upright portion 54 of the prong 32 in an inboard direction 118 (toward the screw terminal 24 of an outlet 10). The profile of the upright 54 may be relatively narrow so that the prong 32 can extend into the narrow openings. After passing through the narrow opening the spring or resilient joint 116 may urge the contact 46 to the screw terminal 24. The conductivity of the prong 32 may be maintained through the spring or resilient joint 116.

Figure 10F:
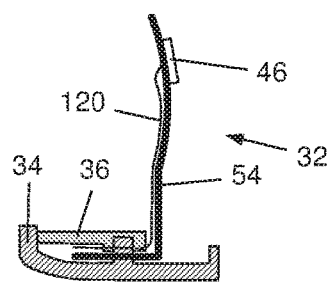

FIG. 10F shows a prong 32 that includes an upright 54 that may or may not be conductive and an electrical contact 46 located on an upper/distal portion of the prong 32. The upright 54 may or may not be flexible and/or resilient. For example, the upright 54 may be made of a plastic material that may or may not be resilient or provide spring force. A conductor 120 may be connected to the contact 46 and pass into the internal space (e.g., to an electrical circuit) of the active cover plate 28.

Figure 10G:
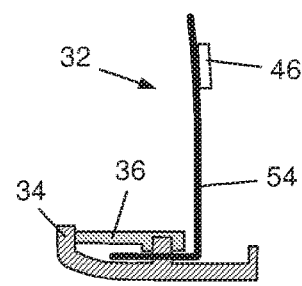

FIG. 10G shows one embodiment where the electrical contact 46 is a magnet that is attached to a flexible upright 54. For example, the flexible upright 54 may be made of any material and have any of a number of different geometries. In one embodiment, the flexible upright 54 has a bending moment (stiffness, resistance to bending) that is small in one direction and significantly greater in another direction. For example, the magnet may be on the end of a sheet that can easily bend toward or away from the screw terminal 24, thereby allowing the magnetic force between the magnet and the screw terminal 24 to bring the magnet into contact with the screw terminal 24. In other dimensions or axes of rotation, the upright 54 may be more rigid to allow the magnet and corresponding prong 32 to be more accurately or easily maneuvered into position. For example, the upright 54 may be relatively rigid for motion that is in and out of the page. This would allow the upright 54 to support the weight of the magnet during installation of the active cover plate 28 over a wall mounted GFCI outlet 10.

FIGS. 11A-11F are various illustrative embodiments of prongs 32 for active cover plates 28. FIGS. 11A and 11B show a prong 32 that includes an upright, conductive element 54 and a rear insulating element 40 that includes slots 122 or slits 122 to increase its flexibility. The upright, conductive element 54 many be any of a number of different elements, including conductive plastic or metal. It may be resilient and may or may not have its inboard side partially covered by insulation. It may have any shape that is appropriate. The slots 122 allow the thickness of the insulation 40 to be maintained while increasing the flexibility of the prong 32 overall.

FIGS. 11C and 11D show prongs 32 comprising a number of joints 124 and stiffer segments 126 that work together to increase the flexibility and resilience of the prong 32. This embodiment and the following embodiment includes a base 52 and a segmented upright 54. FIG. 11C shows the prong 32 in its rest position with the contact 46 extending inward/inboard. During insertion or the application of forces that tend to straighten the prong 32, it straightens and elongates using the flexure provided by the joints 124. When the force(s) are removed, the prong 32 may return to its rest position to urge or initiate contact with the screw terminal 24 of the GFCI outlet 10. FIGS. 11E and 11F show an illustrative embodiment with different joints 124. In general, there could be any number of joints 124 in the prong and they could be located anywhere within the prongs 32 to facilitate the function of the prongs 32 and electrical contact between the contact(s) 46 and the screw terminals 24.

As used in the specification and appended claims, the term "free end" means free to move in at least one translational direction. For example, in FIG. 10B, the insulated end 60 of the contact 46 is a free end because it can extend or move in the transverse direction as shown in FIGS. 11A and 11B. Similarly, the prongs 32 shown in FIG. 11C-11F can extend or move in the transverse direction when forces are applied (compare for example FIGS. 11C and 11E with FIGS. 11D and 11F). The illustrative prongs 32 shown in FIGS. 2A-2K have a contact 46 with a free end 60 (see e.g. FIG. 2H) that can translate in the transverse plane that is generally parallel to the front of the upright 54. The free end 60 of the contact 46 may be on the far end of the contact 46 (relative to the base 52 of the prong 32) as shown in FIGS. 11G and 11H. Additionally or alternatively, the free end 60 may be on the near side of the contact 46 (relative to the base 52 of the prong 32) as shown in FIGS. 2A-2K. Further, both ends of the contact 46 may have limited freedom as shown in FIG. 6D-6I.

Figure 12:
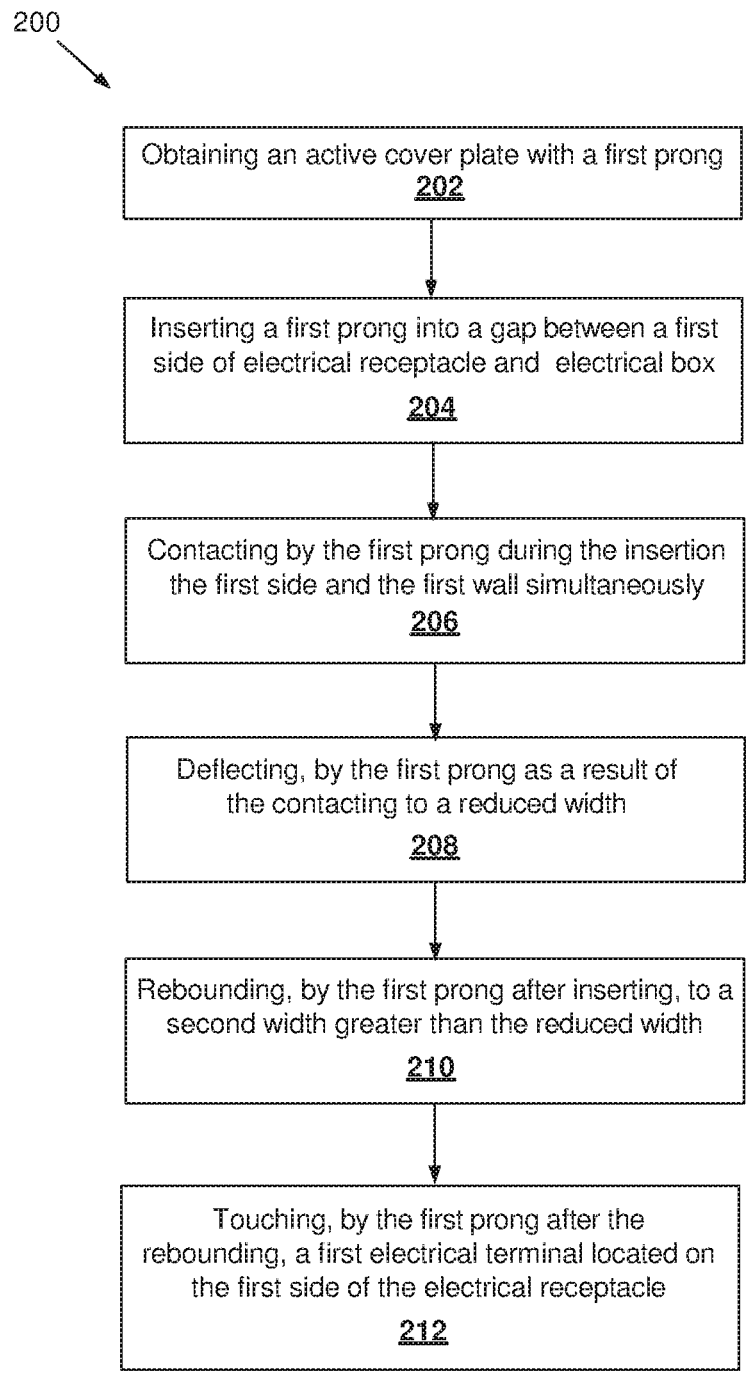
FIG. 12 shows an illustrative method for insertion of a prong of an active cover plate to touch an electrical terminal of an electrical receptacle, according to one embodiment of principles described herein.

In addition to the steps and description of principles described above, FIG. 12 shows an illustrative method 200 for insertion of a prong of an active cover plate to touch an electrical terminal of an electrical receptacle. The method includes obtaining an active cover plate with a first prong (step 202). The active cover plate may include a front plate and a first prong extending away for a backside of the front plate. The first prong is inserted into a first gap between a first side of an electrical receptacle and a first wall of an electrical box in which the electrical receptacle is installed (step 204). The method may also include contacting, by the first prong during the inserting, the first side and first wall simultaneously (step 206). As a result of the contacting, the first prong deflects to a reduced width (step 208). After inserting, the first prong may rebound to a second width greater than the reduced width (step 210). After rebounding the first prong may touch a first electrical terminal located on the first side of the electrical receptacle (step 212).

In some embodiments, the first prong may further comprise a first electrical contact, wherein the touching comprises physical contact between the first electrical contact and the first electrical terminal. The active cover plate may further comprise electronic circuitry connected to the front plate and conductive material extending to connect the first electrical contact to the electronic circuitry.

Additionally, the active cover plate may include a second prong with a second electrical contact. In some embodiments, the inserting further comprises inserting the second prong into a second gap between a second side of the electrical receptacle and a second wall of the electrical box. The contacting may further include contacting, by the second prong during the inserting, the second side and the second wall simultaneously. The deflecting may further comprise deflecting by the second prong as a result of the contacting to the reduced width. The touching may further comprise touching, by the second prong after the rebounding, a second electrical terminal located on the second side of the electrical receptacle.

The preceding description has been presented only to illustrate and describe examples of the principles and features described. This description is not intended to be exhaustive or to limit these principles to any precise form disclosed. Many modifications and variations are possible in light of the above teaching.

What is claimed is:

1. An active cover plate extending in longitudinal, lateral, and transverse directions that are orthogonal to one another, the active cover plate comprising:
   a front plate comprising a front surface, a back surface, and at least one primary aperture, wherein the at least one primary aperture extends through the front plate in the transverse direction;
   a prong connecting to the back surface of the front plate at a location outboard of the at least one primary aperture;
   the prong comprising
      a conductive upright extending rearward away from the back surface of the front plate in the transverse direction,
      an electrically insulative material positioned inboard of and overlaying at least a portion of the conductive upright,
      the material having a contact aperture extending in the lateral direction therethrough,
      a resilient contact comprising first end, second end, and middle portion, the resilient contact electrically connected to the conductive upright, and
      the resilient contact bowing out through the contact aperture.

2. The active cover plate of claim 1, wherein:
   the middle portion is located between the first and second ends;
   the first and second ends are positioned proximate the conductive upright; and
   the middle portion bows away from the conductive upright in the lateral direction.

3. The active cover plate of claim 1, wherein the first end is fixed with respect to the conductive upright.

4. The active cover plate of claim 3, wherein the first end is farther away in the transverse direction from the back surface of the front plate than is the second end.

5. The active cover plate of claim 1, wherein the conductive upright comprises an opening extending in the lateral direction therethrough.

6. The active cover plate of claim 5, wherein the resilient contact arches over at least a portion of the opening.

7. The active cover plate of claim 1, wherein the prong further comprises a distal tip formed of an insulative material.

8. The active cover plate of claim 7, wherein the distal tip comprises an inboard surface that angles outward in both the lateral and transverse directions.

9. The active cover plate of claim 1, further comprising an electric load connected to the front plate, and
   conductive material extending to connect the conductive upright to the electric load.

10. The active cover plate of claim 9, wherein:
    the front plate further comprises at least one light aperture; and
    the electric load comprises a light source directing light out through the at least one light aperture.

11. An active cover plate extending in longitudinal, lateral, and transverse directions that are orthogonal to one another, the active cover plate comprising:
    a front plate comprising a front surface, a back surface, and at least one primary aperture, wherein the at least one primary aperture extends through the front plate in the transverse direction;
    a prong connecting to the back surface of the front plate at a location outboard of the at least one primary aperture;
    the prong comprising a metal clip, the metal clip comprising:
       a conductive upright extending rearward away from the back surface of the front plate in the transverse direction, the conductive upright comprising an opening extending in the lateral direction therethrough, a resilient contact electrically connected to the conductive upright, and the resilient contact extending to at least partially cover the opening in the conductive upright in the lateral direction.

12. The active cover plate of claim 11, wherein:

the resilient contact has a first end, second end, and middle portion located between the first and second ends;

the first end is connected to the conductive upright;

the second end is positioned proximate the conductive upright; and the middle portion bows away from the conductive upright.

13. The active cover plate of claim 11, wherein the prong further comprises a front insulator covering at least a portion of an inboard side of the conductive upright.

14. The active cover plate of claim 13, wherein the front insulator comprises a contact aperture extending therethrough.

15. The active cover plate of claim 14, wherein the resilient contact bows out through the contact aperture.

16. The active cover plate of claim 11, wherein the prong further comprises a back insulator covering at least a portion of an outboard side of the upright, the back insulator comprising a ramp forming a distal end of the prong.

17. An active cover plate comprising:

a face plate comprising at least one primary aperture, a front, and a back;

a back plate abutting the back of the face plate;

at least one prong extending away from the back of the face plate, the at least one prong comprising:

a conductive upright having an inward side and an outward side, a contact comprising a first end, a second end, and a middle portion, wherein the middle portion is connected by the first end to the conductive upright;

a front insulator that covers at least a portion of the inward side of the conductive upright, and a back insulator that covers at least a portion of an outward side of the conductive upright;

electric circuitry positioned between the face plate and the back plate; the electric circuitry electrically connected to the conductive upright; and the electric circuitry comprising at least one light source positioned to project light out of the active cover plate.

18. The active cover plate of claim 17, wherein a monolithic piece of material comprises both the conductive upright and the contact.

19. The active cover plate of claim 17, wherein:

the middle portion is located between the first and second ends;

the first end is electrically connected to the conductive upright;

the second end is positioned proximate the conductive upright; and the middle portion bows away from the conductive upright.

20. The active cover plate of claim 17, wherein:

the front insulator comprises a contact aperture extending therethrough; and the contact extends out through the contact aperture.

* * * * *